(12) United States Patent
Osborne

(10) Patent No.: US 8,199,934 B2
(45) Date of Patent: Jun. 12, 2012

(54) AUDIO LEVEL COMPRESSOR

(76) Inventor: Gary T. Osborne, Indianapolis, IN (US)

(\*) Notice: Subject to any disclaimer, the term of this patent is extended or adjusted under 35 U.S.C. 154(b) by 877 days.

(21) Appl. No.: 12/272,534

(22) Filed: Nov. 17, 2008

(65) Prior Publication Data

US 2009/0136061 A1    May 28, 2009

Related U.S. Application Data

(60) Provisional application No. 60/988,540, filed on Nov. 16, 2007.

(51) Int. Cl.
*H03G 3/00* (2006.01)
(52) U.S. Cl. ........ 381/107; 381/104; 381/105; 381/106; 381/122; 704/500
(58) Field of Classification Search .................. None
See application file for complete search history.

(56) References Cited

U.S. PATENT DOCUMENTS

| | | | |
|---|---|---|---|
| 1,668,583 A | 5/1928 | Carter |
| 1,875,157 A | 8/1932 | Roberts |
| 1,940,874 A | 12/1933 | Metz |
| 2,021,491 A | 11/1935 | Ruben |
| 2,137,020 A | 11/1938 | Luck |
| 2,248,785 A | 7/1941 | Roberts |
| 2,256,071 A | 9/1941 | Bruk |
| 2,268,872 A | 1/1942 | Hewlett |
| 2,281,644 A | 5/1942 | Weathers |
| 2,835,744 A | 5/1958 | Harris |
| 2,869,095 A | 1/1959 | Arson |
| 3,037,414 A | 6/1962 | Meinema |
| 3,126,455 A | 3/1964 | Golonski |
| 3,219,961 A | 11/1965 | Bailey |
| 3,225,304 A | 12/1965 | Richards |
| 3,281,724 A | 10/1966 | Schafft |
| 3,333,208 A | 7/1967 | Hudak |
| 3,449,684 A | 6/1969 | Kagan |
| 3,463,868 A | 8/1969 | Laube |
| 3,555,192 A | 1/1971 | Hymer |
| 3,604,853 A | 9/1971 | Pless |
| 3,949,180 A | 4/1976 | Ojima |

(Continued)

OTHER PUBLICATIONS

Dennis Bohn et al., "AES standard for professional audio equipment—Application of connectors, part 1, XLR-type polarity and gender" (Preview only); AES14-1992 (r2004); www.aes.org/publications/standards; Audio Engineering Society, Inc., New York, USA; Mar. 3, 2004; 4 pages.

(Continued)

*Primary Examiner* — Fernando L Toledo
*Assistant Examiner* — Mark A Laurenzi
(74) *Attorney, Agent, or Firm* — Tapt, Stettinius & Hollister, LLP; Anthony P. Filomena

(57) ABSTRACT

An audio level compressor for compressing the dynamic range of an input audio signal. The audio level compressor can be part of a microphone, or a separate component. The audio level compressor includes input terminals for receiving the input audio signal, a lamp having a filament resistance that is a function of the input audio signal; a load resistance; a signal gain controller that includes a means for increasing dynamic range compression of the input audio signal, and output terminals for providing an output audio signal that is a function of the input audio signal and the signal gain. The signal gain controller provides a signal gain that is a function of the filament resistance and the load resistance. The audio level compressor can also include an expander circuit or a power conditioning circuit. Power can be provided by an internal source or a phantom power supply.

58 Claims, 25 Drawing Sheets

U.S. PATENT DOCUMENTS

| | | | |
|---|---|---|---|
| 4,000,370 | A | 12/1976 | Smith |
| 4,122,507 | A | 10/1978 | Queen |
| 4,261,628 | A | 4/1981 | Gallagher |
| 4,378,467 | A | 3/1983 | Ferrantelli |
| 5,434,536 | A | 7/1995 | Pritchard |
| 6,810,125 | B2 | 10/2004 | Oster |

OTHER PUBLICATIONS

Ray A Rayburn, "A brief history of the XLR connector"; www.soundfirst.com/XLR/XLR_History.pdf; Boulder, Colorado; Dec. 16, 2008; 4 pages.

Elliott, Rod; '48V Phantom Feed Supply for Microphones; The Audio Pages, Elliot Sound Products (ESP), Project 96, 7 pages; Jun. 13, 2003.

"Ampeg Reverberocket Model R-12R Model R-212R Technical Specifications;" SLM Electronics, 1400 Ferguson Avenue, St. Louis, MO 63133; 2 pages; Nov. 1997.

Mayes, Lawrence; "Audio Compressor;" Ipswich, Suffolk; 3 pages; Jul. 1978.

"Audio XL;" ITT Interconnect Solutions, ITT Corporation, 666 East Dyer Road, Santa Ana, CA 92705; 43 pages; Jun. 2008.

Ford, Ty; "Beyerdynamic MCD 100 Digital Microphone, Apr. 2000;" www.beyerdynamic.com; 3 pages; May 13, 2004.

"Core Sound 2Phant: Introduction: 2Phant Portable, Two-Channel Phantom Power;" Core Sound, 300 Ogden Avenue, Teaneck, NJ 07666; www.core-sound.com/2Phant/1.php; 3 pages; Jul. 9, 2006.

"DYC-817: External dynamic compressor for the FT-817;" Funkamateur-Leserservice, Box 73, 10122 Berlin; www.funkamateur.de; 2 pages; Apr. 2002.

"Reviews Summary for DYC-817 Speech Compressor;" eHam.net; 5 pages; Jun. 25, 2004.

"Dynamic Range & Headroom;" Yamaha Sound Information Series: Technical Information for Users of Yamaha Professional Audio Products; www.yamaha.com/yamahavgn/CDA/ContentDetail/WrappedTextDetail.html?CNTID=48553&CTID=227500; 4 pages; Nov. 2006.

"Dynamic range compression;" Wikipedia, the free encyclopedia, en.wikipedia.org/wiki/Dynamic_range_compression, 13 pages; 2008.

"Eikon Instruction Manual: 1/4' Mono Plug;" Eikon Device Inc., 692 McKay Street, Kingston, ON Canada; 1 page; 2003.

"GCX20 Dual Compressor Noise Gate: Operation Manual;" LA Audio, Version 1, 19 pages; Apr. 2000.

Brice, Richard; "The 'Hot-Lamp' speaker-simulator which models HT supply depression and voice-coil heating effects;" 3 pages; Jan. 2006.

"Live Mixing Consoles: Live Range Brochure;" Soundcraft USA, 1449 Donelson Pike, Nashville, TN, A Harmon International Company, 24 pages, Feb. 2002.

"Audio Compressor;" Medium Wave Alliance, Engineering Department, 1 page, 2003.

Salas, Phil; "Audio Speech Compressor for the FT-817 (and other rigs);" 2 pages; Oct. 19, 2001.

Maskrey, Jon; "Polar Patterns Explained;" 4 pages; 2006.

"Shure Pro Audio: Why does 'Proximity Effect' occur?;" Shure Incorporated; 5 pages; 2008.

Jeffs et al.; "Dynamics Processors—Technology & Application Tips;" RaneNote 155: Dynamics Processors; Rane Corporation, 10802 47th Avenue W, Mukilteo, WA; 28 pages; 2005.

Ross, Monty; "Power Amplifier Clipping and Its Effects on Loudspeaker Reliability;" RaneNote 128; Rane Corporation, 10802 47th Avenue W, Mukilteo, WA; 4 pages; 1991.

"Shure: Model SM58 Dynamic Microphone: Specification Sheet;" Shure Inc., 2 pages; 2008.

"Pinouts.RU: Professional Audio / entertainment devices 3 pin XLR connector pinout;" 2 pages; Feb. 20, 2006.

| Illumination | V (V) | I (mA) | T (Ω) | Vin=Vout(Vin/Vout) | Vout/Vin=R/(R+T) | Vout=I*R |
|---|---|---|---|---|---|---|
| none | 0.00511 | 0.255 | 20.039 | 0.014 | 0.6222 | 0.0084 |
| none | 0.00980 | 0.490 | 20.000 | 0.026 | 0.6226 | 0.0162 |
| none | 0.01503 | 0.750 | 20.040 | 0.040 | 0.6222 | 0.0248 |
| none | 0.02090 | 1.040 | 20.096 | 0.055 | 0.6215 | 0.0343 |
| none | 0.02530 | 1.245 | 20.321 | 0.066 | 0.6189 | 0.0411 |
| none | 0.0313 | 1.527 | 20.498 | 0.082 | 0.6168 | 0.0504 |
| none | 0.0360 | 1.739 | 20.702 | 0.093 | 0.6145 | 0.0574 |
| none | 0.0422 | 2.012 | 20.974 | 0.109 | 0.6114 | 0.0664 |
| none | 0.0480 | 2.259 | 21.248 | 0.123 | 0.6083 | 0.0745 |
| none | 0.0540 | 2.495 | 21.643 | 0.136 | 0.6039 | 0.0823 |
| none | 0.0603 | 2.740 | 22.007 | 0.151 | 0.5999 | 0.0904 |
| none | 0.0675 | 2.997 | 22.523 | 0.166 | 0.5944 | 0.0989 |
| none | 0.0758 | 3.260 | 23.252 | 0.183 | 0.5867 | 0.1076 |
| none | 0.0843 | 3.522 | 23.935 | 0.201 | 0.5796 | 0.1162 |
| none | 0.0923 | 3.750 | 24.613 | 0.216 | 0.5728 | 0.1238 |
| none | 0.1018 | 3.990 | 25.514 | 0.233 | 0.5640 | 0.1317 |
| none | 0.1132 | 4.249 | 26.642 | 0.253 | 0.5533 | 0.1402 |
| none | 0.1282 | 4.533 | 28.281 | 0.278 | 0.5385 | 0.1496 |
| none | 0.1406 | 4.738 | 29.675 | 0.297 | 0.5265 | 0.1564 |
| none | 0.1606 | 5.009 | 32.062 | 0.326 | 0.5072 | 0.1653 |
| none | 0.1856 | 5.269 | 35.225 | 0.359 | 0.4837 | 0.1739 |
| none | 0.2231 | 5.549 | 40.205 | 0.406 | 0.4508 | 0.1831 |
| none | 0.2593 | 5.738 | 45.190 | 0.449 | 0.4220 | 0.1894 |
| none | 0.2969 | 5.833 | 50.900 | 0.489 | 0.3933 | 0.1925 |
| none | 0.3468 | 6.033 | 57.484 | 0.546 | 0.3647 | 0.1991 |
| none | 0.4042 | 6.242 | 64.755 | 0.610 | 0.3376 | 0.2060 |
| none | 0.4721 | 6.494 | 72.698 | 0.686 | 0.3122 | 0.2143 |
| dim | 0.5424 | 6.773 | 80.083 | 0.766 | 0.2918 | 0.2235 |
| ↧ | 0.6015 | 7.004 | 85.879 | 0.833 | 0.2776 | 0.2311 |
| ↧ | 0.6624 | 7.261 | 91.227 | 0.902 | 0.2656 | 0.2396 |
| ↧ | 0.7173 | 7.494 | 95.717 | 0.965 | 0.2564 | 0.2473 |
| ↧ | 0.7783 | 7.753 | 100.387 | 1.034 | 0.2474 | 0.2558 |
| ↧ | 0.7799 | 7.756 | 100.554 | 1.036 | 0.2471 | 0.2559 |
| ↧ | 0.8469 | 8.035 | 105.401 | 1.112 | 0.2384 | 0.2652 |
| ↧ | 0.9036 | 8.269 | 109.276 | 1.176 | 0.2319 | 0.2729 |
| ↧ | 0.9736 | 8.550 | 113.871 | 1.256 | 0.2247 | 0.2822 |
| ↧ | 1.0300 | 8.765 | 117.513 | 1.319 | 0.2193 | 0.2892 |
| ↧ | 1.1130 | 9.093 | 122.402 | 1.413 | 0.2124 | 0.3001 |
| ↧ | 1.1560 | 9.260 | 124.838 | 1.462 | 0.2091 | 0.3056 |
| ↧ | 1.2330 | 9.551 | 129.096 | 1.548 | 0.2036 | 0.3152 |
| ↧ | 1.2910 | 9.757 | 132.315 | 1.613 | 0.1996 | 0.3220 |
| bright | 1.3690 | 10.038 | 136.382 | 1.700 | 0.1948 | 0.3313 |
| ↧ | 1.4350 | 10.279 | 139.605 | 1.774 | 0.1912 | 0.3392 |
| ↧ | 1.5170 | 10.564 | 143.601 | 1.866 | 0.1869 | 0.3486 |
| ↧ | 1.5720 | 10.759 | 146.110 | 1.927 | 0.1842 | 0.3550 |
| ↧ | 1.6470 | 11.018 | 149.483 | 2.011 | 0.1808 | 0.3636 |
| ↧ | 1.7270 | 11.283 | 153.062 | 2.099 | 0.1774 | 0.3723 |
| ↧ | 1.7860 | 11.486 | 155.494 | 2.165 | 0.1751 | 0.3790 |
| ↧ | 1.8600 | 11.725 | 158.635 | 2.247 | 0.1722 | 0.3869 |
| ↧ | 1.9140 | 11.890 | 160.976 | 2.306 | 0.1701 | 0.3924 |
| ↧ | 1.9750 | 12.085 | 163.426 | 2.374 | 0.1680 | 0.3988 |
| ↧ | 2.0320 | 12.260 | 165.742 | 2.437 | 0.1660 | 0.4046 |
| ↧ | 2.1180 | 12.526 | 169.088 | 2.531 | 0.1633 | 0.4134 |
| ↧ | 2.1980 | 12.765 | 172.190 | 2.619 | 0.1608 | 0.4212 |
| very bright | 2.2670 | 12.967 | 174.828 | 2.695 | 0.1588 | 0.4279 |

FIG. 2

| Illumination | V (V) | I (mA) | T (Ω) | Vin=Vout(Vin/Vout) | Vout/Vin=R/T | Vout=I*R |
|---|---|---|---|---|---|---|
| none | 0.00511 | 0.255 | 20.039 | 0.005 | 1.6468 | 0.0084 |
| none | 0.00980 | 0.490 | 20.000 | 0.010 | 1.6500 | 0.0162 |
| none | 0.01503 | 0.750 | 20.040 | 0.015 | 1.6467 | 0.0248 |
| none | 0.02090 | 1.040 | 20.096 | 0.021 | 1.6421 | 0.0343 |
| none | 0.02530 | 1.245 | 20.321 | 0.025 | 1.6239 | 0.0411 |
| none | 0.0313 | 1.527 | 20.498 | 0.031 | 1.6099 | 0.0504 |
| none | 0.0360 | 1.739 | 20.702 | 0.036 | 1.5941 | 0.0574 |
| none | 0.0422 | 2.012 | 20.974 | 0.042 | 1.5734 | 0.0664 |
| none | 0.0480 | 2.259 | 21.248 | 0.048 | 1.5531 | 0.0745 |
| none | 0.0540 | 2.495 | 21.643 | 0.054 | 1.5247 | 0.0823 |
| none | 0.0603 | 2.740 | 22.007 | 0.060 | 1.4995 | 0.0904 |
| none | 0.0675 | 2.997 | 22.523 | 0.068 | 1.4652 | 0.0989 |
| none | 0.0758 | 3.260 | 23.252 | 0.076 | 1.4193 | 0.1076 |
| none | 0.0843 | 3.522 | 23.935 | 0.084 | 1.3787 | 0.1162 |
| none | 0.0923 | 3.750 | 24.613 | 0.092 | 1.3407 | 0.1238 |
| none | 0.1018 | 3.990 | 25.514 | 0.102 | 1.2934 | 0.1317 |
| none | 0.1132 | 4.249 | 26.642 | 0.113 | 1.2387 | 0.1402 |
| none | 0.1282 | 4.533 | 28.281 | 0.128 | 1.1668 | 0.1496 |
| none | 0.1406 | 4.738 | 29.675 | 0.141 | 1.1120 | 0.1564 |
| none | 0.1606 | 5.009 | 32.062 | 0.161 | 1.0292 | 0.1653 |
| none | 0.1856 | 5.269 | 35.225 | 0.186 | 0.9368 | 0.1739 |
| none | 0.2231 | 5.549 | 40.205 | 0.223 | 0.8208 | 0.1831 |
| none | 0.2593 | 5.738 | 45.190 | 0.259 | 0.7303 | 0.1894 |
| none | 0.2969 | 5.833 | 50.900 | 0.297 | 0.6483 | 0.1925 |
| none | 0.3468 | 6.033 | 57.484 | 0.347 | 0.5741 | 0.1991 |
| none | 0.4042 | 6.242 | 64.755 | 0.404 | 0.5096 | 0.2060 |
| none | 0.4721 | 6.494 | 72.698 | 0.472 | 0.4539 | 0.2143 |
| dim | 0.5424 | 6.773 | 80.083 | 0.542 | 0.4121 | 0.2235 |
| ∥ | 0.6015 | 7.004 | 85.879 | 0.602 | 0.3843 | 0.2311 |
| ∥ | 0.6624 | 7.261 | 91.227 | 0.662 | 0.3617 | 0.2396 |
| ∥ | 0.7173 | 7.494 | 95.717 | 0.717 | 0.3448 | 0.2473 |
| ∥ | 0.7783 | 7.753 | 100.387 | 0.778 | 0.3287 | 0.2558 |
| ∥ | 0.7799 | 7.756 | 100.554 | 0.780 | 0.3282 | 0.2559 |
| ∥ | 0.8469 | 8.035 | 105.401 | 0.847 | 0.3131 | 0.2652 |
| ∥ | 0.9036 | 8.269 | 109.276 | 0.904 | 0.3020 | 0.2729 |
| ∥ | 0.9736 | 8.550 | 113.871 | 0.974 | 0.2898 | 0.2822 |
| ∥ | 1.0300 | 8.765 | 117.513 | 1.030 | 0.2808 | 0.2892 |
| ∥ | 1.1130 | 9.093 | 122.402 | 1.113 | 0.2696 | 0.3001 |
| ∥ | 1.1560 | 9.260 | 124.838 | 1.156 | 0.2643 | 0.3056 |
| ∥ | 1.2330 | 9.551 | 129.096 | 1.233 | 0.2556 | 0.3152 |
| ∨ | 1.2910 | 9.757 | 132.315 | 1.291 | 0.2494 | 0.3220 |
| bright | 1.3690 | 10.038 | 136.382 | 1.369 | 0.2420 | 0.3313 |
| ∥ | 1.4350 | 10.279 | 139.605 | 1.435 | 0.2364 | 0.3392 |
| ∥ | 1.5170 | 10.564 | 143.601 | 1.517 | 0.2298 | 0.3486 |
| ∥ | 1.5720 | 10.759 | 146.110 | 1.572 | 0.2259 | 0.3550 |
| ∥ | 1.6470 | 11.018 | 149.483 | 1.647 | 0.2208 | 0.3636 |
| ∥ | 1.7270 | 11.283 | 153.062 | 1.727 | 0.2156 | 0.3723 |
| ∥ | 1.7860 | 11.486 | 155.494 | 1.786 | 0.2122 | 0.3790 |
| ∥ | 1.8600 | 11.725 | 158.635 | 1.860 | 0.2080 | 0.3869 |
| ∥ | 1.9140 | 11.890 | 160.976 | 1.914 | 0.2050 | 0.3924 |
| ∥ | 1.9750 | 12.085 | 163.426 | 1.975 | 0.2019 | 0.3988 |
| ∥ | 2.0320 | 12.260 | 165.742 | 2.032 | 0.1991 | 0.4046 |
| ∥ | 2.1180 | 12.526 | 169.088 | 2.118 | 0.1952 | 0.4134 |
| ∨ | 2.1980 | 12.765 | 172.190 | 2.198 | 0.1916 | 0.4212 |
| very bright | 2.2670 | 12.967 | 174.828 | 2.267 | 0.1888 | 0.4279 |

FIG. 8

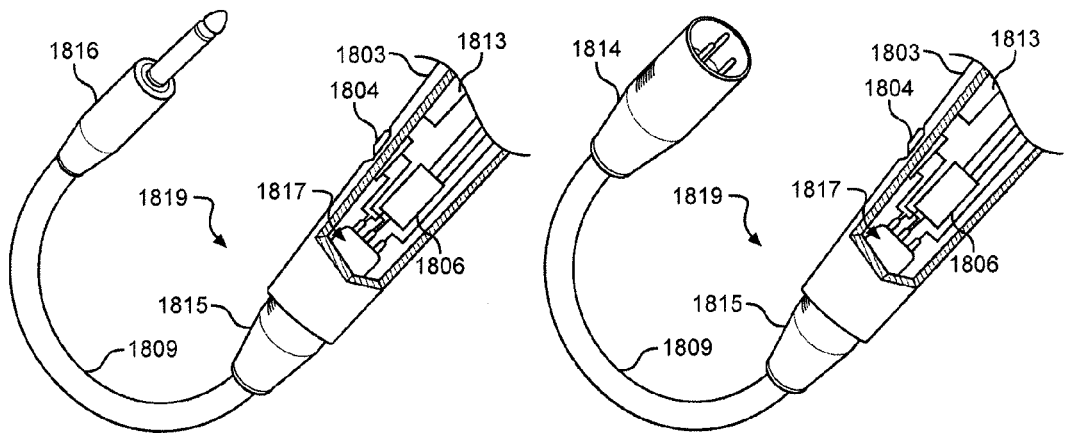
FIG. 17B   FIG. 17A
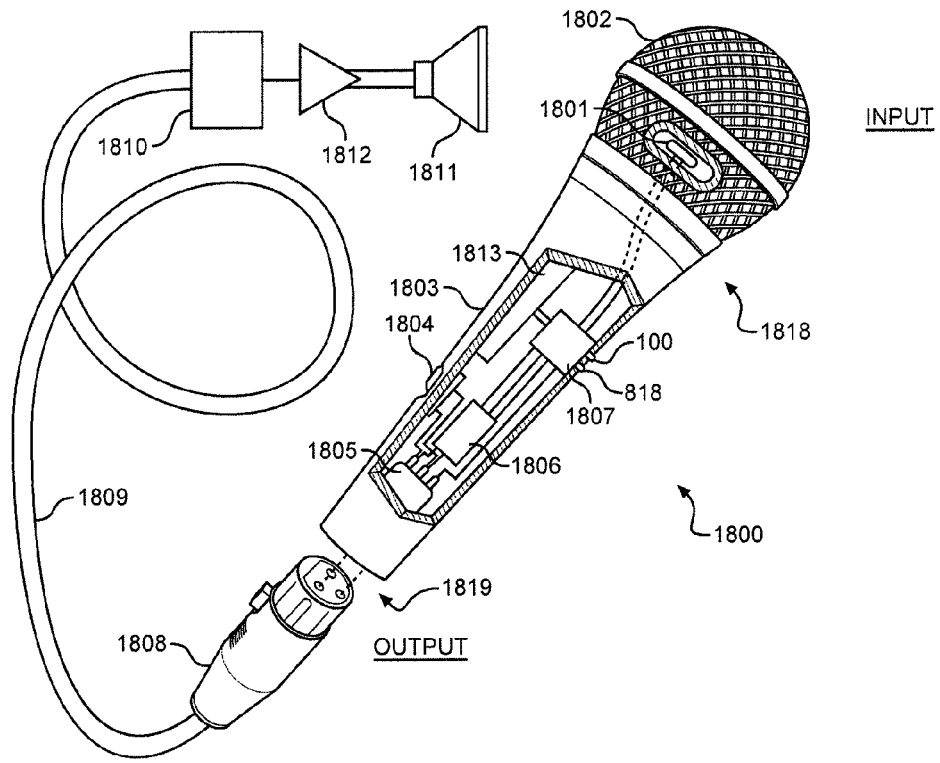
FIG. 17

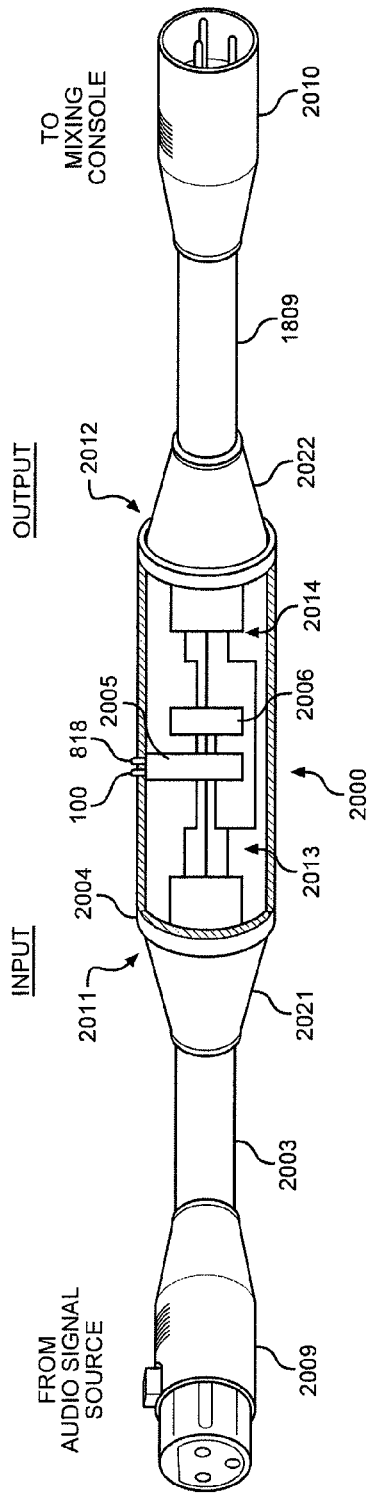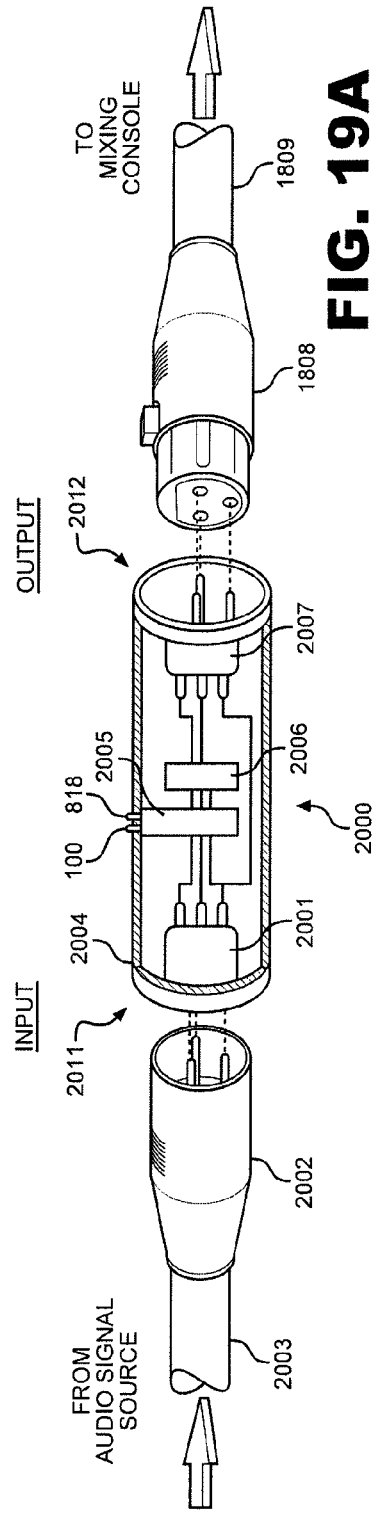

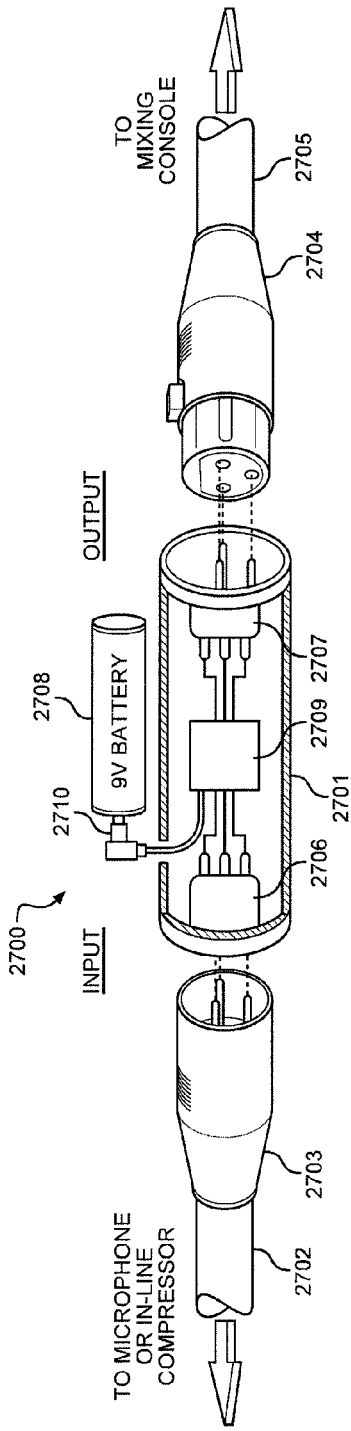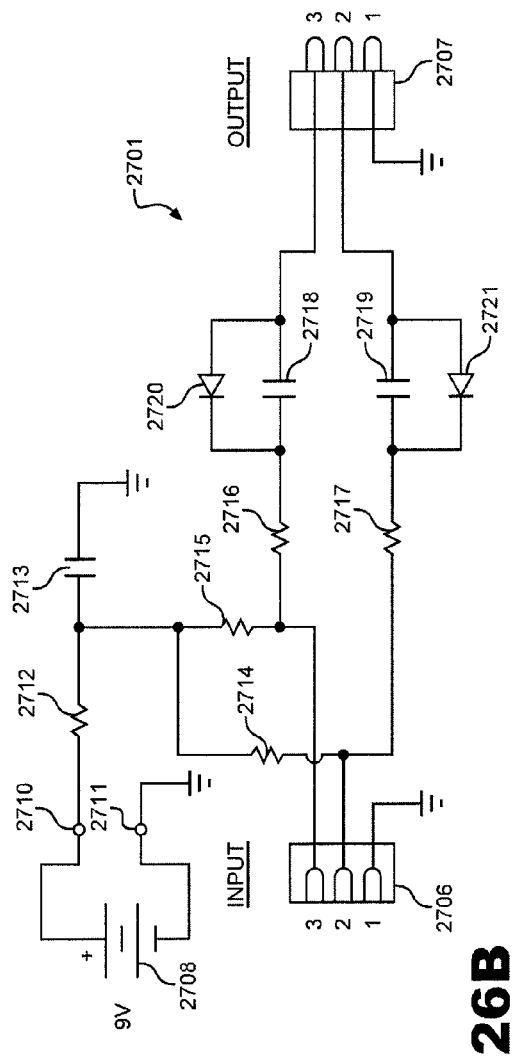
FIG. 26A
FIG. 26B

| | | | | | | W<br>T0 = 20<br>R = 47.5<br>R1 = 1<br>R2 = 1<br>A = 0.65 | | | X<br>T0 = 20<br>R = 47.5<br>R1 = 1<br>R2 = 1<br>A = 0.5 | | | Y<br>T0 = 20<br>R = 47.5<br>R1 = 1<br>R2 = 1<br>A = 0.3 | | | Z<br>T0 = 20<br>R = 47.5<br>R1 = 1<br>R2 = 1<br>A = -2.5 | | |
|---|---|---|---|---|---|---|---|---|---|---|---|---|---|---|---|---|---|
| | | | | | Gain Curve | 3204 | 3304 | | 3203 | 3303 | | 3202 | 3302 | | 3201 | 3301 | |
| Illumination | V (V) | I (mA) | T (Ω) | V3 | V3 (dB) | V1 | V1 (dB) | Ratio | V1 | V1 (dB) | Ratio | V1 | V1 (dB) | Ratio | V1 | V1 (dB) | Ratio |
| none | 0.00511 | 0.255 | 20.039 | 0.0121 | -38.5 | 0.001 | -49.6 | | 0.005 | -38.8 | | 0.010 | -33.0 | | 0.078 | -15.2 | |
| none | 0.00980 | 0.490 | 20.000 | 0.0233 | -22.6 | 0.003 | -44.0 | | 0.019 | -27.4 | | 0.019 | -27.4 | | 0.149 | -9.5 | |
| none | 0.01503 | 0.750 | 20.040 | 0.0356 | -19.1 | 0.004 | -40.2 | 1.0 | 0.015 | -29.4 | 1.0 | 0.029 | -23.7 | 1.0 | 0.229 | -5.8 | 1.0 |
| none | 0.02090 | 1.040 | 20.096 | 0.0494 | -16.3 | 0.006 | -37.3 | 1.1 | 0.021 | -26.6 | 1.0 | 0.041 | -20.8 | 1.0 | 0.317 | -3.0 | 1.0 |
| none | 0.02530 | 1.245 | 20.321 | 0.0591 | -14.7 | 0.008 | -35.4 | 1.1 | 0.025 | -24.9 | 1.0 | 0.049 | -19.2 | 1.0 | 0.380 | -1.4 | 1.0 |
| none | 0.0313 | 1.527 | 20.498 | 0.0725 | -12.9 | 0.010 | -33.4 | 1.2 | 0.031 | -23.1 | 1.1 | 0.060 | -17.4 | 1.0 | 0.466 | 0.4 | 1.0 |
| none | 0.0360 | 1.739 | 20.702 | 0.0826 | -11.6 | 0.011 | -32.0 | 1.2 | 0.036 | -21.9 | 1.1 | 0.069 | -16.2 | 1.0 | 0.532 | 1.5 | 1.0 |
| none | 0.0422 | 2.012 | 20.974 | 0.0956 | -10.5 | 0.014 | -30.4 | 1.3 | 0.042 | -20.5 | 1.1 | 0.080 | -14.9 | 1.1 | 0.616 | 2.8 | 1.0 |
| none | 0.0480 | 2.259 | 21.248 | 0.1073 | -9.5 | 0.016 | -29.0 | 1.4 | 0.048 | -19.4 | 1.1 | 0.091 | -13.8 | 1.1 | 0.692 | 3.8 | 1.0 |
| none | 0.0540 | 2.495 | 21.643 | 0.1185 | -8.7 | 0.018 | -27.7 | 1.5 | 0.054 | -18.3 | 1.2 | 0.101 | -12.9 | 1.1 | 0.765 | 4.7 | 1.0 |
| none | 0.0603 | 2.740 | 22.007 | 0.1302 | -7.9 | 0.021 | -26.4 | 1.7 | 0.060 | -17.4 | 1.2 | 0.112 | -12.0 | 1.1 | 0.841 | 5.5 | 1.0 |
| none | 0.0675 | 2.997 | 22.523 | 0.1424 | -7.1 | 0.025 | -25.1 | 1.8 | 0.068 | -16.4 | 1.3 | 0.124 | -11.1 | 1.2 | 0.922 | 6.3 | 1.0 |
| none | 0.0758 | 3.260 | 23.252 | 0.1549 | -6.4 | 0.029 | -23.6 | 1.9 | 0.076 | -15.4 | 1.4 | 0.138 | -10.2 | 1.2 | 1.005 | 7.1 | 1.0 |
| none | 0.0843 | 3.522 | 23.935 | 0.1673 | -5.7 | 0.034 | -22.3 | 2.1 | 0.084 | -14.5 | 1.4 | 0.151 | -9.4 | 1.2 | 1.088 | 7.7 | 1.0 |
| none | 0.0923 | 3.750 | 24.613 | 0.1781 | -5.1 | 0.039 | -21.2 | 2.2 | 0.092 | -13.7 | 1.5 | 0.164 | -8.7 | 1.3 | 1.161 | 8.3 | 1.0 |
| none | 0.1018 | 3.990 | 25.514 | 0.1895 | -4.6 | 0.045 | -19.9 | 2.5 | 0.102 | -12.8 | 1.7 | 0.178 | -8.0 | 1.4 | 1.239 | 8.9 | 1.1 |
| none | 0.1132 | 4.249 | 26.642 | 0.2018 | -4.0 | 0.053 | -18.6 | 2.7 | 0.113 | -11.9 | 1.8 | 0.194 | -7.2 | 1.5 | 1.324 | 9.5 | 1.1 |
| none | 0.1282 | 4.533 | 28.281 | 0.2153 | -3.5 | 0.064 | -16.9 | 3.0 | 0.128 | -10.8 | 2.0 | 0.214 | -6.4 | 1.6 | 1.420 | 10.1 | 1.1 |
| none | 0.1406 | 4.738 | 29.675 | 0.2251 | -3.1 | 0.073 | -15.7 | 3.4 | 0.141 | -10.0 | 2.3 | 0.231 | -5.7 | 1.8 | 1.491 | 10.5 | 1.1 |
| none | 0.1606 | 5.009 | 32.062 | 0.2379 | -2.6 | 0.089 | -14.0 | 4.0 | 0.161 | -8.9 | 2.7 | 0.256 | -4.8 | 2.1 | 1.588 | 11.0 | 1.2 |
| none | 0.1856 | 5.269 | 35.225 | 0.2503 | -2.2 | 0.111 | -12.1 | 4.6 | 0.186 | -7.6 | 3.2 | 0.286 | -3.9 | 2.4 | 1.687 | 11.6 | 1.3 |
| none | 0.2231 | 5.549 | 40.205 | 0.2636 | -1.7 | 0.144 | -9.8 | 5.7 | 0.223 | -6.0 | 4.0 | 0.329 | -2.7 | 3.1 | 1.805 | 12.1 | 1.4 |
| none | 0.2693 | 5.738 | 46.190 | 0.2726 | -1.4 | 0.178 | -8.0 | 6.3 | 0.259 | -4.7 | 4.6 | 0.366 | -1.7 | 3.5 | 1.895 | 12.6 | 1.5 |
| none | 0.2969 | 5.833 | 50.900 | 0.2771 | -1.3 | 0.214 | -6.4 | 6.7 | 0.297 | -3.5 | 5.0 | 0.408 | -0.8 | 3.9 | 1.959 | 12.9 | 1.6 |
| none | 0.3468 | 6.033 | 57.484 | 0.2866 | -1.0 | 0.261 | -4.7 | 6.1 | 0.347 | -2.2 | 4.8 | 0.461 | 0.3 | 3.9 | 2.066 | 13.3 | 1.6 |
| none | 0.4042 | 6.242 | 64.755 | 0.2965 | -0.7 | 0.315 | -3.0 | 4.9 | 0.404 | -0.9 | 4.0 | 0.523 | 1.4 | 3.3 | 2.183 | 13.8 | 1.6 |
| none | 0.4721 | 6.494 | 72.698 | 0.3085 | -0.4 | 0.380 | -1.4 | 4.4 | 0.472 | 0.5 | 3.7 | 0.595 | 2.5 | 3.1 | 2.323 | 14.3 | 1.5 |
| dim | 0.5424 | 6.773 | 80.063 | 0.3217 | 0.0 | 0.446 | 0.0 | 3.6 | 0.542 | 1.7 | 3.3 | 0.671 | 3.6 | 2.8 | 2.473 | 14.9 | 1.5 |
| II | 0.6015 | 7.004 | 85.879 | 0.3327 | 0.3 | 0.502 | 1.0 | 3.3 | 0.602 | 2.6 | 2.9 | 0.735 | 4.3 | 2.6 | 2.598 | 15.3 | 1.4 |
| II | 0.6624 | 7.261 | 91.227 | 0.3449 | 0.6 | 0.559 | 2.0 | 3.0 | 0.662 | 3.4 | 2.7 | 0.800 | 5.1 | 2.4 | 2.732 | 15.7 | 1.4 |
| II | 0.7173 | 7.494 | 95.717 | 0.3560 | 0.9 | 0.611 | 2.7 | 2.8 | 0.717 | 4.1 | 2.5 | 0.860 | 5.7 | 2.3 | 2.853 | 16.1 | 1.4 |
| II | 0.7783 | 7.753 | 100.387 | 0.3683 | 1.2 | 0.668 | 3.5 | 2.7 | 0.778 | 4.8 | 2.4 | 0.926 | 6.3 | 2.2 | 2.988 | 16.5 | 1.4 |
| II | 0.7799 | 7.756 | 100.554 | 0.3684 | 1.2 | 0.669 | 3.5 | 2.6 | 0.780 | 4.9 | 2.3 | 0.927 | 6.4 | 2.1 | 2.990 | 16.5 | 1.4 |
| II | 0.8469 | 8.035 | 105.401 | 0.3817 | 1.5 | 0.732 | 4.3 | 2.5 | 0.847 | 5.6 | 2.3 | 1.000 | 7.0 | 2.1 | 3.137 | 16.9 | 1.4 |
| II | 0.9036 | 8.269 | 109.276 | 0.3928 | 1.7 | 0.786 | 4.9 | 2.5 | 0.904 | 6.1 | 2.3 | 1.061 | 7.5 | 2.1 | 3.260 | 17.3 | 1.4 |
| II | 0.9736 | 8.550 | 113.871 | 0.4061 | 2.0 | 0.852 | 5.6 | 2.4 | 0.974 | 6.8 | 2.2 | 1.136 | 8.1 | 2.0 | 3.410 | 17.7 | 1.3 |
| II | 1.0300 | 8.765 | 117.513 | 0.4163 | 2.2 | 0.905 | 6.1 | 2.3 | 1.030 | 7.3 | 2.2 | 1.197 | 8.6 | 2.0 | 3.528 | 18.0 | 1.3 |
| II | 1.1130 | 9.093 | 122.402 | 0.4319 | 2.6 | 0.983 | 6.9 | 2.3 | 1.113 | 7.9 | 2.1 | 1.286 | 9.2 | 2.0 | 3.705 | 18.4 | 1.3 |
| II | 1.1560 | 9.260 | 124.838 | 0.4399 | 2.7 | 1.024 | 7.2 | 2.2 | 1.156 | 8.3 | 2.1 | 1.332 | 9.5 | 2.0 | 3.795 | 18.6 | 1.3 |
| II | 1.2330 | 9.551 | 129.096 | 0.4537 | 3.0 | 1.097 | 7.8 | 2.2 | 1.233 | 8.8 | 2.1 | 1.414 | 10.0 | 2.0 | 3.955 | 19.0 | 1.3 |
| V | 1.2910 | 9.757 | 132.315 | 0.4635 | 3.2 | 1.152 | 8.2 | 2.2 | 1.291 | 9.2 | 2.1 | 1.476 | 10.4 | 1.9 | 4.072 | 19.2 | 1.3 |
| bright | 1.3690 | 10.038 | 136.382 | 0.4768 | 3.4 | 1.226 | 8.8 | 2.2 | 1.369 | 9.7 | 2.1 | 1.560 | 10.9 | 1.9 | 4.230 | 19.5 | 1.3 |
| II | 1.4350 | 10.279 | 139.605 | 0.4883 | 3.6 | 1.289 | 9.2 | 2.1 | 1.435 | 10.2 | 2.0 | 1.630 | 11.3 | 1.9 | 4.365 | 19.8 | 1.3 |
| II | 1.5170 | 10.564 | 143.601 | 0.5018 | 3.9 | 1.366 | 9.7 | 2.1 | 1.517 | 10.6 | 2.0 | 1.718 | 11.7 | 1.9 | 4.528 | 20.1 | 1.3 |
| II | 1.5720 | 10.759 | 146.110 | 0.5111 | 4.0 | 1.419 | 10.1 | 2.1 | 1.572 | 10.9 | 2.0 | 1.776 | 12.0 | 1.9 | 4.638 | 20.3 | 1.3 |
| II | 1.6470 | 11.018 | 149.483 | 0.5234 | 4.2 | 1.490 | 10.5 | 2.1 | 1.647 | 11.3 | 2.0 | 1.856 | 12.4 | 1.8 | 4.787 | 20.6 | 1.3 |
| II | 1.7270 | 11.283 | 153.062 | 0.5359 | 4.4 | 1.566 | 10.9 | 2.1 | 1.727 | 11.8 | 2.0 | 1.941 | 12.8 | 1.9 | 4.943 | 20.9 | 1.3 |
| II | 1.7860 | 11.486 | 155.494 | 0.5456 | 4.6 | 1.622 | 11.2 | 2.1 | 1.786 | 12.1 | 2.0 | 2.004 | 13.1 | 1.9 | 5.060 | 21.1 | 1.3 |
| II | 1.8600 | 11.725 | 158.635 | 0.5569 | 4.8 | 1.693 | 11.6 | 2.0 | 1.860 | 12.4 | 2.0 | 2.083 | 13.4 | 1.9 | 5.202 | 21.3 | 1.3 |
| II | 1.9140 | 11.890 | 160.976 | 0.5648 | 4.9 | 1.745 | 11.8 | 2.1 | 1.914 | 12.7 | 2.0 | 2.140 | 13.6 | 1.9 | 5.303 | 21.5 | 1.4 |
| II | 1.9750 | 12.085 | 163.426 | 0.5740 | 5.0 | 1.803 | 12.1 | 2.1 | 1.975 | 12.9 | 2.0 | 2.205 | 13.9 | 1.9 | 5.419 | 21.7 | 1.4 |
| II | 2.0320 | 12.260 | 165.742 | 0.5824 | 5.2 | 1.857 | 12.4 | 2.0 | 2.032 | 13.2 | 1.9 | 2.265 | 14.1 | 1.9 | 5.526 | 21.9 | 1.3 |
| II | 2.1180 | 12.526 | 169.088 | 0.5950 | 5.3 | 1.940 | 12.8 | 2.0 | 2.118 | 13.5 | 2.0 | 2.356 | 14.5 | 1.9 | 5.688 | 22.1 | 1.4 |
| V | 2.1980 | 12.765 | 172.190 | 0.6063 | 5.5 | 2.016 | 13.1 | | 2.198 | 13.9 | | 2.441 | 14.8 | | 5.836 | 22.3 | |
| very bright | 2.2670 | 12.967 | 174.828 | 0.6159 | 5.6 | 2.082 | 13.4 | | 2.267 | 14.1 | | 2.513 | 15.0 | | 5.963 | 22.5 | |

FIG. 30

AUDIO LEVEL COMPRESSOR

This application claims priority to U.S. Provisional Patent Application No. 60/988,540, filed Nov. 16, 2007, entitled "Audio Level Compressor."

BACKGROUND AND SUMMARY

This invention relates to audio signal processing, and more specifically to a novel combination of an incandescent lamp and an audio amplifier for compressing the dynamic range of an audio signal carrying an audio program. Dynamic range compression is the action of automatically increasing the volume of quiet portions of the audio program and decreasing the volume of loud portions of the audio program.

In embodiments of the invention, an amplifier amplifies an audio signal and applies a voltage to a lamp's filament. The applied voltage causes a current to flow through the filament which dissipates power at a rate determined by the product of the applied voltage times the induced current. The rate of power dissipation and other factors create a temperature rise in the filament. A given increase in the audio signal level causes a corresponding rise in the filament's temperature. As a result of the temperature rise, the filament's resistance increases due to its positive temperature coefficient property. Thus, a change in audio signal level creates a corresponding change in filament resistance.

Although prior compressors and limiters have utilized lamp filament resistance for changing signal gain, the signal gain controller disclosed herein has a means for increasing dynamic range compression which utilizes filament resistance changes to a greater extent than the prior compressors, and in doing so, realizes unforeseen advantages and improvements that will become obvious after a thorough reading of the specification and drawings included herein. Unique configurations disclosed herein provide greater utilization of this change in filament resistance and provide a greater change in signal gain for a given change in the audio signal level.

Exemplary embodiments disclosed herein provide low-cost, high fidelity, professional quality, easy-to-use, audio level compressors for compressing the dynamic range of an audio signal produced by a musical instrument, a stage microphone, or another audio signal source. The compressor has a signal gain controller for providing signal gain to the audio signal. The signal gain controller includes a filament having a filament resistance, a load resistance, and a means for increasing dynamic range compression. When change in the audio signal level creates a corresponding change in the filament resistance, the signal gain controller provides a substantial signal gain change in response to the filament resistance change. As such, the substantial signal gain change is a result of the signal gain controller using the filament resistance more efficiently than the prior art in order to provide greater dynamic range compression of the audio signal.

Substantial signal gain change occurs when a given change in the filament resistance provides a greater change in the signal gain in order to provide one or more of the following benefits: reduced clipping of the audio signal by a power amplifier, more protection against accidental overload, greater compression of the audio signal dynamic range, increased operable service life of the lamp filament, decreased attack/release time of the automatic volume changes, or enabling the lamp type to play a greater roll in determining the tone quality of the audio program.

Embodiments of the audio level compressor provide automatic volume changes for an audio program being carried by an audio signal in order to compress the dynamic range of the audio signal. The audio level compressor has a means for increasing the signal gain for low-level audio signals comprising an incandescent lamp in combination with an audio amplifier to increase the perceived volume of the audio program, to increase the operable service life of the lamp filament, and to decrease the attack/release time of the automatic volume changes.

Embodiments of the audio level compressor reduce clipping of the audio signal by a power amplifier connected to a loudspeaker. An advantage of greater low-level signal gain is that less signal gain is required of a power amplifier in order to achieve a predetermined volume level of the sound produced by a loudspeaker. Reduced clipping is achieved because the power amplifier has less signal gain. Low-level signals are made louder by the compressor while higher level signals are not. This allows the higher level signals to pass through the power amplifier with less signal gain and therefore less clipping. As an alternative to less power amplifier clipping, a less powerful power amplifier can be used to reduce the overall cost the audio system.

Embodiments of the audio level compressor provide more protection against accidental overload. In this respect, greater low-level signal gain results in less signal gain being provided by the power amplifier and greater protection against accidental overload. Accidental overload occurs when the audio signal reaches an extreme, unexpected high level. Accidental overload can damage the power amplifier, loudspeaker, and the ear drums of nearby listeners. When the audio program is produced by a microphone, accidental overload can be a common occurrence and a nuisance. Embodiments can provide more protection against accidental overload by providing more compression of the audio signal's dynamic range.

Embodiments include an audio level compressor for a stage microphone having a body with an input end and an output end, and a transducer means being sensitive to sound for converting sounds to an audio signal. The transducer means is located within a windscreen means for protecting the transducer means from wind, vocal plosives, and physical damage. The windscreen means is located at the input end of the body. The microphone can have a directional pickup pattern that decreases unwanted audio feedback by decreasing the microphone's sensitivity to sounds coming toward the output end relative to its sensitivity to sounds coming toward the input end. To further decrease unwanted audio feedback, an audio compression circuit located inside the body and/or the windscreen can compress the dynamic range of the audio signal. A means for providing the compressed output audio signal from the microphone can be located at the output end of the body. This means for providing the compressed output audio signal can include a 3-pin male XLR connector or a ¼ inch phone plug. The audio level compressor can have a power conditioning circuit means for providing power to the compression circuit means from a battery or a phantom power source located outside the body. When the microphone has the 3-pin male XLR connector, the power conditioning circuit means receives the phantom power through the XLR connector. The power conditioning circuit means can include a battery located within the microphone for providing power to the compression circuit means when the phantom power supply is unavailable, or when the microphone does not have the 3-pin male XLR connector.

For greater convenience, embodiments can have factory preset control settings for compression and attack/release of the automatic volume change so that the microphone users (stage performers, band members, lectors, rabbis, ministers, school administrators, politicians, business executives, etc.) are not required to understand or adjust any control settings.

Even though a variety of prior-art professional quality compressors are commercially available, they are sometimes not used with stage microphones because the setup time is prohibitive. Setup of a prior-art compressor consists of connecting a microphone cable between a microphone and a mixing console, connecting a pair of cables between the compressor and the mixing console send/return connectors, and adjusting control settings at the compressor and mixing console.

Embodiments disclosed herein can have small physical size to allow permanent installation inside the body of a stage microphone thereby completely eliminating setup time. While this is certainly a great convenience, it also creates an unexpected, dramatic change in the attitudes of the microphone users.

By live-sound testing, it was discovered that the time constraints and demands of preparing a live performance caused band members (musicians and vocalists) to have little interest in using compressors for microphones. But band members who had a compressor set up for them were later grateful for the improved sound quality and fewer audio feedback problems. In addition, the band members' confidence was observed to shift dramatically when given a choice whether or not to use a compressor-equipped microphone. In a performance where two microphones of the same make and model were used, one microphone had a compressor and the other did not. Two band members could choose which microphone to use for singing. After a few songs, both preferred the compressor-equipped microphone. Throughout the course of their performance, their confidence in a compressor-equipped microphone grew while their confidence in the other microphone diminished. Given the choice, the band members did not want to use the microphone without the compressor because it was so inferior in their opinions.

Another band member praised the compressor-equipped microphone for its better clarity and "hotter and crisper" tone quality. It should be noted that the "hotter and crisper" tone quality arose from the perceived volume increase which enabled the band member to position his mouth farther away from the microphone and decrease the microphone's proximity effect bass-boost.

When a compressor is permanently located inside a microphone, band members receive the benefits of audio level compression without setup time—and their attitudes undergo a dramatic, unexpected shift from indifference to gratitude and confidence.

Embodiments can also provide an in-line audio level compressor having a body with an input end and an output end, and an audio compression circuit means for compressing the dynamic range of an audio signal from an audio signal source. A means for receiving the input audio signal is located at the input end. A means for providing a compressed output audio signal from the in-line audio level compressor is located at the output end. The means for receiving the input audio signal can include a 3-pin female XLR connector. The means for providing a compressed output audio signal can include a 3-pin male XLR connector. To provide power to the compression circuit means, the in-line audio compressor can have a power conditioning circuit means for receiving phantom power from a phantom power source located outside the microphone, and conditioning the power for the compression circuit means, where the power conditioning circuit means receives the phantom power through the means for providing a compressed output audio signal from the in-line audio level compressor. The in-line compressor can be easily connected between an audio signal source and a mixing console to provide audio level compression for a musical instrument, an audio microphone not having a "built-in" compressor, or another audio signal source.

Some embodiments do not need to have a battery. Instead, power can be received from a phantom power source through a 3-pin male XLR output connector that also sends the audio signal to the mixing console. Operating without a battery can provide an advantage because the in-line compressor can be smaller, more reliable, and in better harmony with the time-constrained, demanding environment of live performance preparation.

Other objects, features and advantages will be readily apparent from the following description of certain exemplary embodiments taken in conjunction with the accompanying drawings although variations and modifications may be effected without departing from the spirit and scope of the novel concepts of the disclosure.

BRIEF DESCRIPTION OF THE DRAWINGS

FIG. 2 is a tabulation of laboratory measurements of the lamp filament resistance T verses filament voltage V for a type T-1 incandescent lamp, and includes calculations of Vin, Vout and Vout/Vin for the compressor of FIG. 1;

FIG. 8 provides the same measurements as FIG. 2 except the calculations of Vin, Vout and Vout/Vin are for the compressor of FIG. 7;

FIG. 17 is a cut-away view of another embodiment where a stage microphone has a compressor circuit board for compressing the microphone transducer's audio signal, and a 3-pin male XLR connector inside the microphone body for receiving phantom power for the circuit board and providing a compressed output audio signal from the microphone;

FIG. 17A is a cut-away view of another embodiment where a stage microphone has a compressor circuit board for compressing the microphone transducer's audio signal, and a 3-pin male XLR connector for receiving phantom power for the circuit board and providing a compressed output audio signal from the microphone;

FIG. 17B is a cut-away view of another embodiment where a stage microphone has a compressor circuit board for compressing the microphone transducer's audio signal, a battery, and a ¼ inch phone plug for providing a compressed output audio signal from the microphone;

FIG. 19A is a cut-away view of another embodiment where an in-line audio level compressor includes a compressor circuit board, a 3-pin female XLR connector located inside a body for receiving an audio signal, a transformer, and a 3-pin male XLR connector located inside the body for providing a compressed output audio signal from the in-line compressor and receiving phantom power for the circuit board;

FIG. 19B is a cut-away view of another embodiment where an in-line audio level compressor includes a compressor circuit board, a 3-pin female XLR connector connected to a body by a cable for receiving an audio signal, a transformer, and a 3-pin male XLR connector connected to the body by another cable for providing a compressed output audio signal from the in-line compressor and receiving phantom power for the circuit board;

FIG. 26A is a cut-way view of an alternate embodiment where an in-line phantom power supply provides power to a compressor inside a stage microphone or to an in-line compressor when a mixing console does not have a phantom power supply;

FIG. 26B is an exemplary schematic diagram of the embodiment of the shown in FIG. 26A;

FIG. 30 shows tabulated values of input and output voltage, and compression ratio for the audio level compressor having adjustable feedback;

DESCRIPTION OF EXEMPLARY EMBODIMENTS

Figure 1:
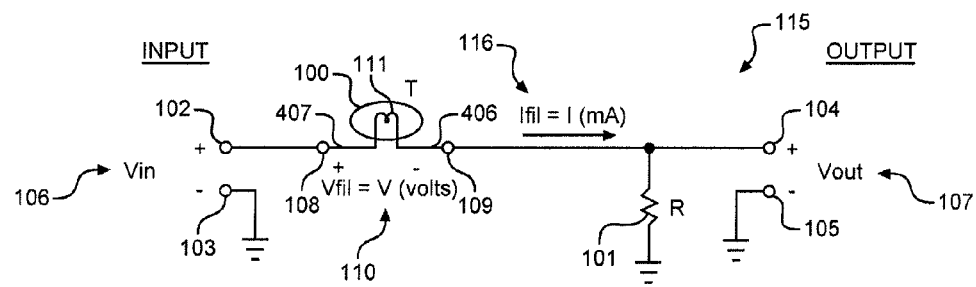
FIG. 1 is a schematic diagram of an audio level compressor having an incandescent lamp.

FIG. 1 shows a compressor 115 comprising an incandescent lamp 100; a load resistor 101; a pair of input terminals 102, 103; and a pair of output terminals 104, 105. The lamp 100 has a filament resistance of T ohms, and the resistor 101 has a constant resistance of R ohms. In operation, an input audio signal 106 having and RMS value of Vin volts is applied to the input terminals 102, 103, and an output audio signal 107 having and RMS value of Vout volts is produced at the output terminals 104, 105.

The lamp 100 and the resistor 101 create a voltage divider where the input signal 106 (Vin) is divided between a filament voltage 110 (Vfil) and the output signal 107 (Vout). The filament voltage 110 is measured at lamp terminals 108, 109 and has a RMS value of Vfil volts, where:

$$Vfil = Vin \frac{T}{R+T} \quad (1)$$

The output signal Vout measured at terminals 104, 105 is:

$$Vout = Vin \frac{R}{R+T} \quad (2)$$

Equation 2 can be rearranged to give a transfer function $$\frac{Vout}{Vin} = \frac{R}{R+T} \quad (3)$$

which determines the signal gain of the compressor 115.

Figure 3:
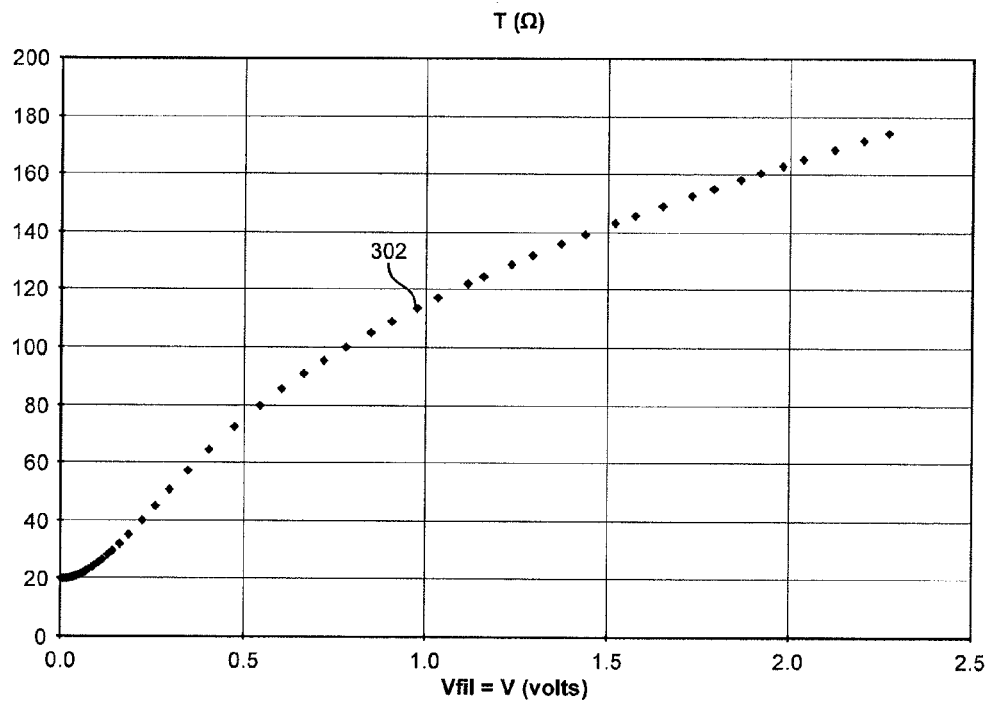
FIG. 3 is a graph of laboratory measurements of the lamp filament resistance T verses filament voltage V for a type T-1 incandescent lamp.
Figure 4:
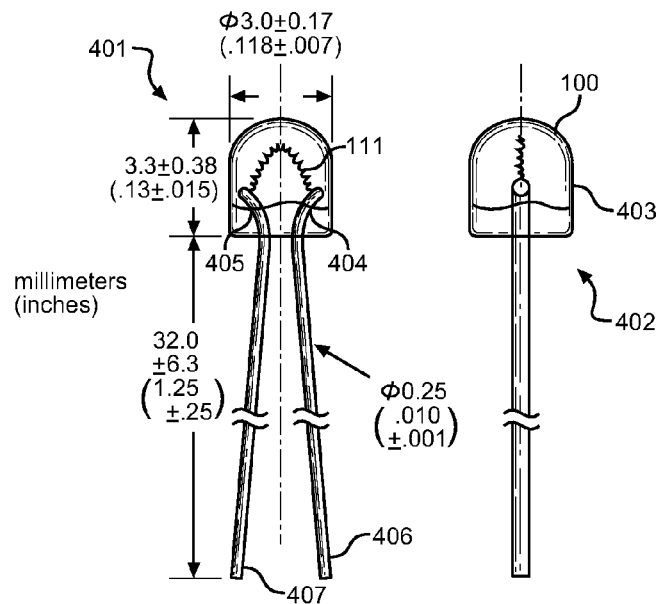
FIG. 4 is a drawing of the front view and the side view of a type T-1 incandescent lamp.

FIG. 4 shows a front view 401 and a side view 402 of a type T-1 miniature incandescent lamp. The type T-1 incandescent lamp has a filament 411; a pair of filament supports 404, 405; wire terminals 406, 407; and a glass bulb 403. FIG. 3 shows a filament resistance curve 302 for a type T-1 miniature lamp verses filament voltage. The filament resistance curve 302 shows that the filament resistance T is a function of the filament voltage Vfil applied to the lamp filament. The filament is an electrical conductor, made of tungsten wire and/or other materials that have a positive temperature coefficient (PTC). For the circuit shown in FIG. 1, an increase in the filament voltage Vfil causes a filament current 116 to flow through the filament 111, heating it; which causes a corresponding increase in the filament resistance T due to the PTC of the lamp filament 111. The filament current 116 has an RMS value of Ifil amperes. The PTC of the filament is determined by a variety of lamp design and environmental factors such as air temperature, black body radiation, the kind of inert gas inside bulb 403, the glass thickness of bulb 403, the heat conduction of filament supports 404, 405, and the filament size, shape, and composition.

An embodiment of the circuit in FIG. 1 was built using a type T-1 miniature lamp for lamp 100 and a 33 ohm resistor for load resistor 101. Data measurements, shown in FIG. 2, were taken using this embodiment to create the resistance curve 302. Various levels of a DC test voltage were applied to the input terminals 102, 103. The filament voltage Vfil was measured with a DC voltmeter connected to the lamp terminals 108, 109. The filament current 116 was measured by a DC ammeter connected in series with one of the wire terminals of the lamp 100. The filament resistance T of the lamp was calculated for each data point by applying Ohm's law to the Vfil and Ifil data collected, where T=Vfil/Ifil. Columns 2-4 of FIG. 2 show the values for Vfil, Ifil and T, respectively. For example, one data point in FIG. 2 shows that when a voltage of Vfil=0.5424 volts was applied to the lamp terminals 108, 109, it caused a current of Ifil=6.773 milliamperes (mA) to flow through the filament 111. The calculated value of T is therefore, 0.5424 V/6.773 mA=80.083 ohms. The filament 111 was observed to be dimly illuminated at this applied DC test voltage.

For measurement verification, the DC test voltage was removed and a 1000 Hertz sine wave AC audio frequency test voltage was applied instead to the input terminals 102, 103. While varying the level of the AC test voltage, it was observed that the lamp filament 111 heated and cooled much slower than the oscillation frequency of the AC test voltage. So it was hypothesized that the RMS values of Vfil and Ifil produced by the AC test voltage could be approximated by the values of Vfil and Ifil produced by the DC test voltage. That hypothesis was verified when the RMS values of Vfil and Ifil were measured and found to be reasonably similar for DC and AC test voltages.

Figure 7:
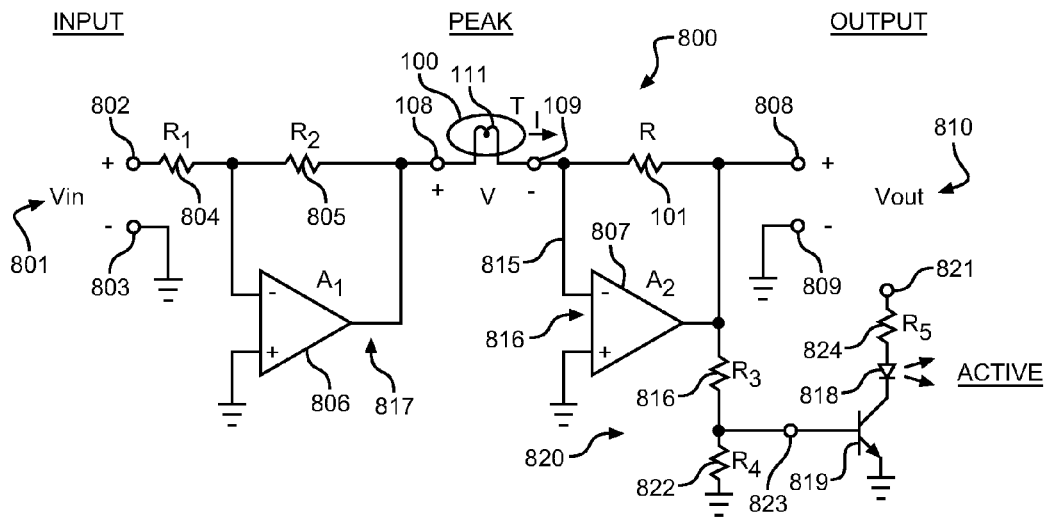
FIG. 7 is a schematic diagram of an embodiment where an audio level compressor has a signal gain controller comprising a load resistor and a lamp connected to a virtual ground of an operational amplifier.
Figure 5:
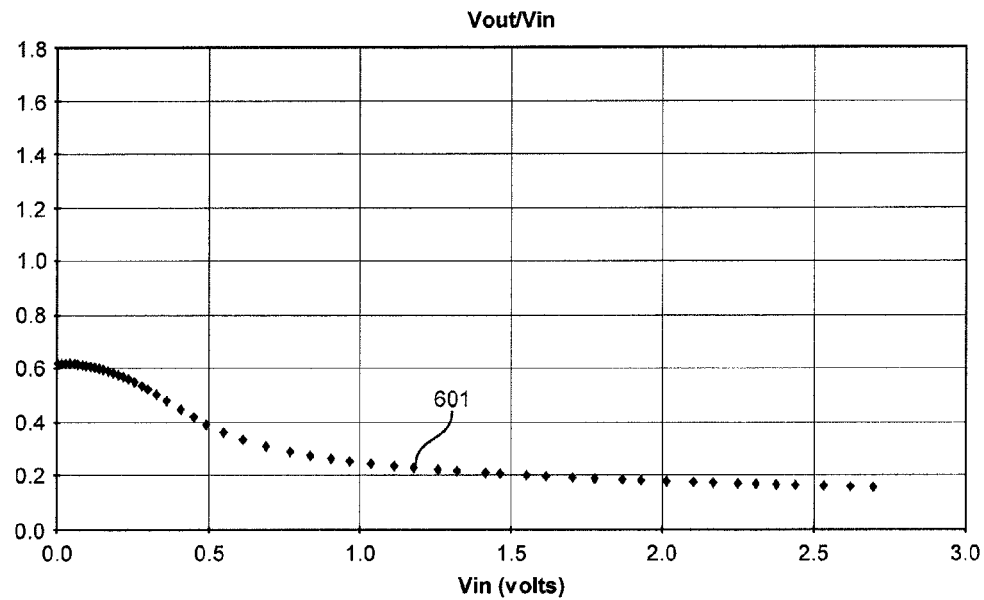
FIG. 5 is a graph of the gain curve for the compressor of FIG. 1.
Figure 6:
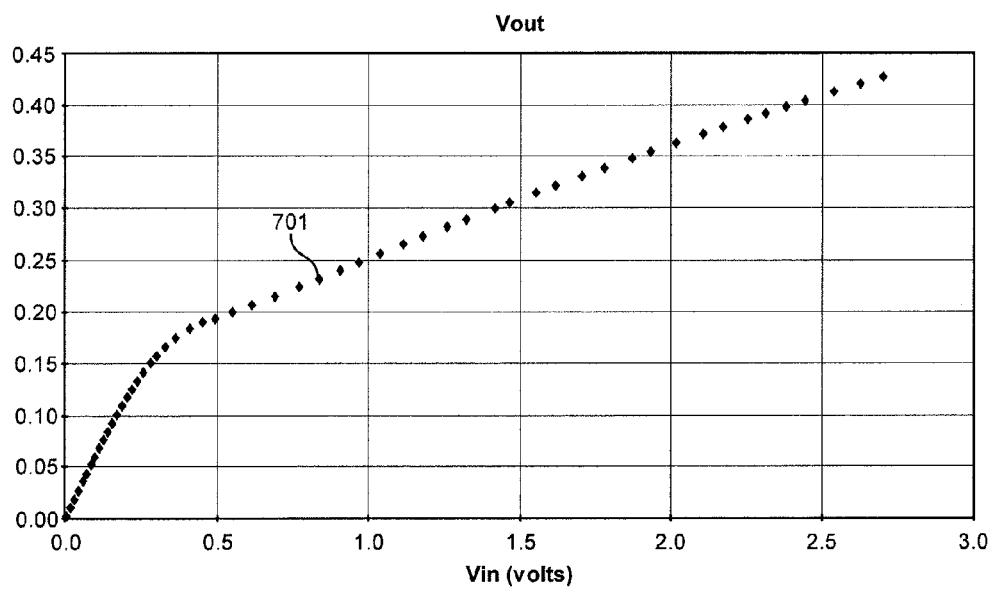
FIG. 6 is a graph of the transfer function curve for the compressor of FIG. 1.

The rightmost three columns of FIG. 2 contain additional data calculated by applying Ohm's law and the transfer function (3) to the measurement data which are plotted in FIGS. 6 and 7. FIG. 6 shows a graph of the transfer function 701, Vout versus Vin, for the compressor 115. FIG. 5 shows a graph of the signal gain 601, Vout/Vin versus Vin, for the compressor 115. These curves show that the compressor 115 can automatically increase the volume of quiet portions of an audio program and decreases the volume of loud portions of the audio program but it's usefulness for high quality level compressor is limited.

FIG. 7 shows an audio level compressor 800 with a pair of input terminals 802, 803 and a pair of output terminals 808, 809. The audio level compressor 800 includes a signal gain controller comprising an incandescent lamp 100, a load resistor 101, and an operational amplifier 807, and a means for increasing dynamic range compression. The incandescent lamp 100 and the load resistor 101 of the audio level compressor 800 can be the same components as the incandescent lamp 100 and the load resistor 101 of the compressor 115. The lamp 100 has a filament 111 with a resistance of T ohms. The resistor 101 has a constant resistance of R ohms.

The means for increasing dynamic range compression includes lamp 100 and resistor 101 being connected to a virtual ground node which exists at an inverting input 815 of the operational amplifier 807. The compressor 800 also includes a lamp-driver amplifier 817 comprising an operational amplifier 806 and resistors 804, 805. The lamp-driver amplifier 817 provides a constant load resistance for the audio signal source and isolates it from changes in filament resistance T of lamp 100. In alternative embodiments, the amplifier 817 can be omitted and replaced by a wire between terminals 802 and 108, or the resistors 804 and 805 can have the same resistance values. The operational amplifier 807 maintains the virtual ground node at the same (ground) voltage potential as the non-inverting input of amplifier 807 because current flows out of the output terminal of amplifier 807 through the resistor 101 into the node 819, while an equal but opposite-phase current flows from the output terminal of amplifier 806 through the lamp 100 into the node 819.

In operation, an input audio signal 801 of Vin volts RMS is applied to the input terminals 802, 803 and an output audio signal 810 of Vout volts RMS is taken from the output terminals 808, 809. The lamp 100, the resistor 101, and the op-amp 807 create an inverting amplifier having a signal gain of (−R/T). The lamp-driver amplifier 817 is another inverting amplifier having a signal gain of (−R2/R1). Multiplying the signal gain of the inverting amplifiers provides a transfer function for compressor 800 of:

$$\frac{Vout}{Vin} = \left(-\frac{R2}{R1}\right)\left(-\frac{R}{T}\right) = \frac{R2}{R1}\frac{R}{T} \quad (4)$$

Figure 9:
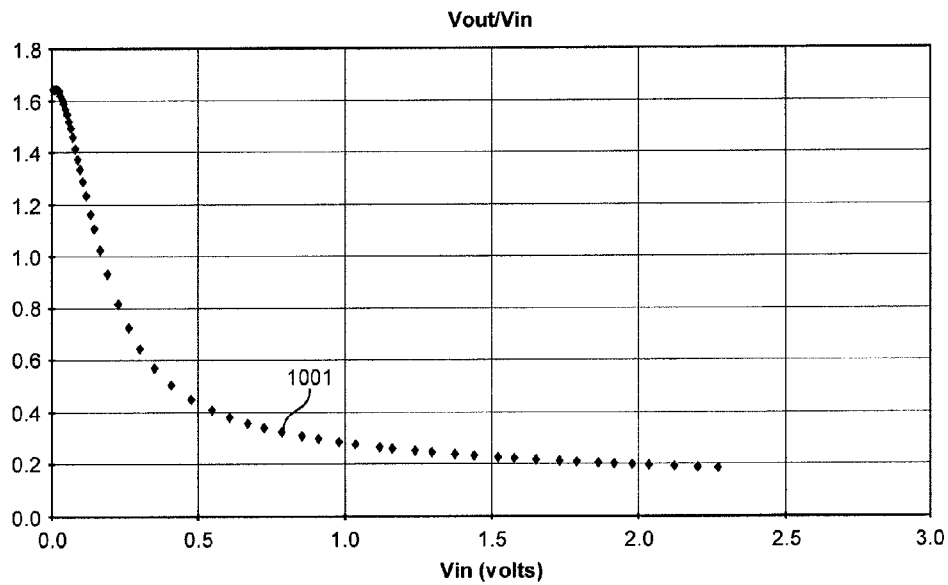
FIG. 9 is a graph of the gain curve for the compressor of FIG. 7.
Figure 10:
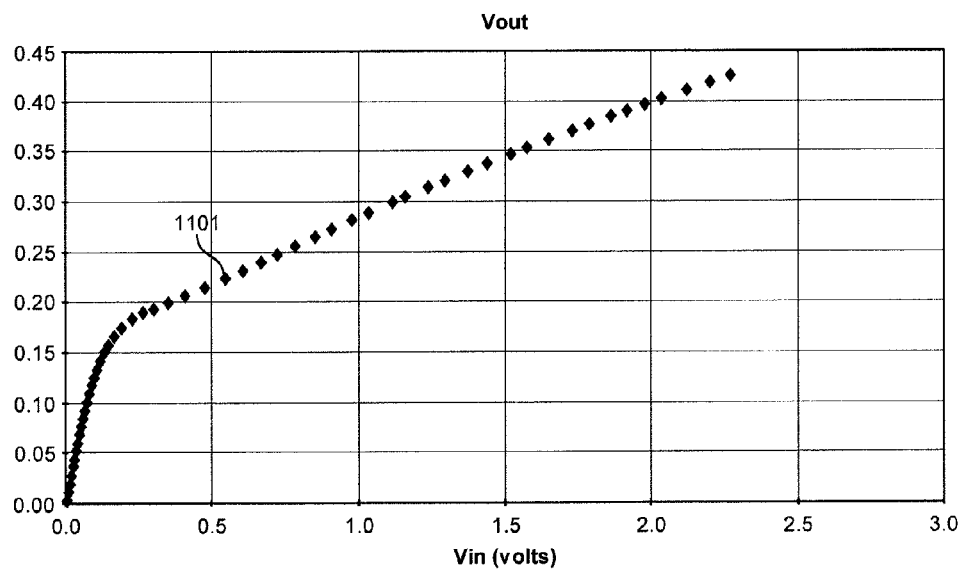
FIG. 10 is a graph of the transfer function curve for the compressor of FIG. 7.

FIG. 8 shows data measurements taken with the compressor 800. Note that the measurements were taken for the same Vfil and Ifil values as shown in FIG. 2 for the compressor 115. Thus columns 2-4 of FIG. 8 are the same as columns 2-4 of FIG. 2. FIG. 8 also shows the values for Vin, Vin/Vout and Vout for the compressor 800 for the case where R1=R2. These values were calculated by applying Ohm's law and the transfer function (4) to the measurement data. FIG. 9 shows a graph of the gain curve 1001, Vout/Vin versus Vin, for the compressor 800 using the data of FIG. 8. FIG. 10 shows a graph of the transfer function 1101, Vout versus Vin, for the compressor 800 using the data of FIG. 8.

Figure 11:
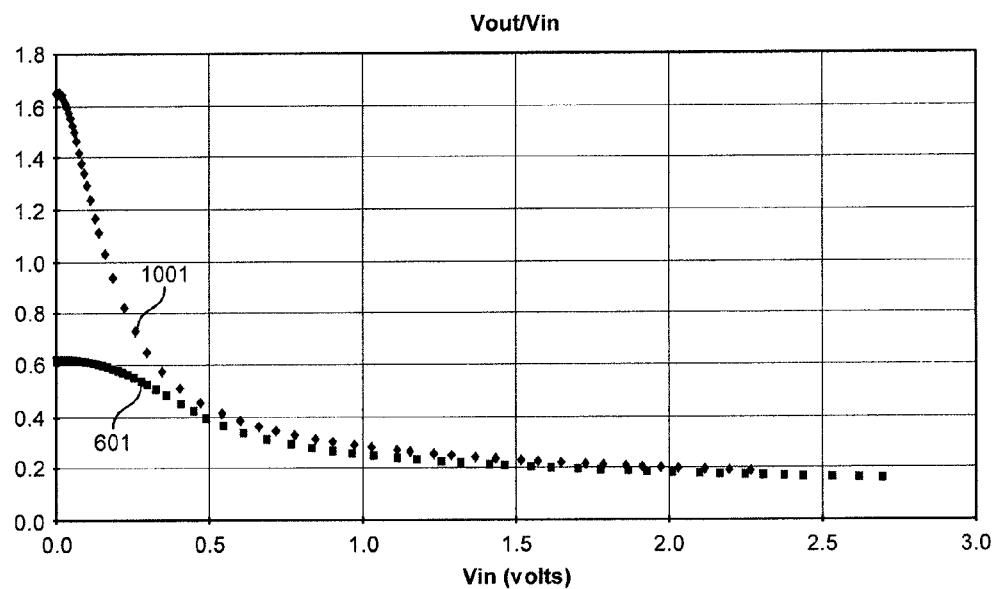
FIG. 11 is a graph of the gain curves for both the compressor of FIG. 7 and the compressor of FIG. 1.
Figure 12:
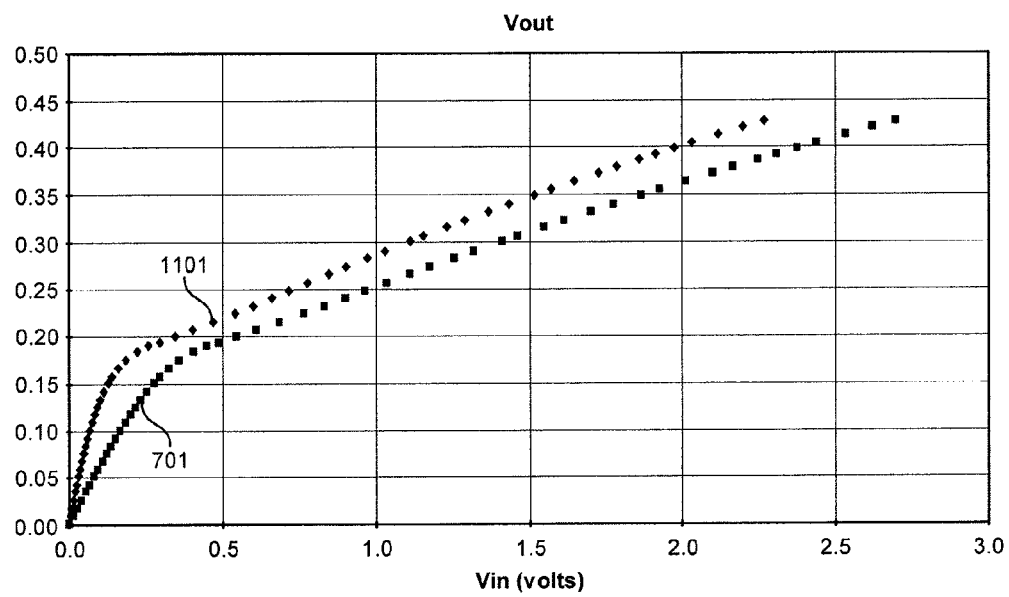
FIG. 12 is a graph of the transfer function curves for both the compressor of FIG. 7 and the compressor of FIG. 1.

For easier comparison of compressors 115 and 800, FIG. 11 shows both of the gain curves 601 and 1001 plotted on the same X and Y axes. The gain curve 601 is for the compressor 115 and the gain curve 1001 is for the compressor 800. FIG. 12 shows both of the transfer function curves 701 and 1101 on the same X and Y axes. The transfer function 701 is for the compressor 115 and the transfer function 1101 is for the compressor 800. These curves show that the compressor 800 provides more signal gain for low-level audio signals than the compressor 115. Low-level audio signals refer to input signal levels less than a reference level which is where the compressor 800 has more signal gain than the compressor 115 and the signal gain difference can not be attributed to measurement error or circuit differences unrelated to the lamp and load resistor. For the examples shown in FIGS. 1 and 7 where the lamps 100 are T-1 lamps and the resistors 101 are 33 ohm resistors, the reference level is at about Vin=0.297 volts. At this reference level, the signal gain of the compressor 800 is more than 23% greater than the signal gain of the compressor 115 (0.6483/0.5265=1.231 [23.1%]). The gain of the compressor 800 is almost 12% greater than the gain of the compressor 115 when the signal gain of both compressors is normalized to 1.0 at about 2.0 volts (0.6483/0.5265)/(0.1991/0.1808)=1.118 [11.8%]).

A comparison of the transfer function (3) for the compressor 115 and the transfer function (4) for the compressor 800 shows the advantage of compressor 800. The transfer function (3) for the compressor 115 has a factor of "R+T" in the denominator. For low-level audio signals, where "T" is at its lowest values, the denominator of the transfer function (3) can not be less than "R" regardless of the kind of lamp used. This prevents the denominator of the transfer function (3) from being small enough to provide substantial signal gain. In contrast, the transfer function (4) for the compressor 800 does not have this limitation. The transfer function (4) for the compressor 800, when R1=R2, has simply a factor of "T" in the denominator. For a given load resistance and lamp type, "T" is less than "R+T", especially for low-level audio signals.

Figure 13:
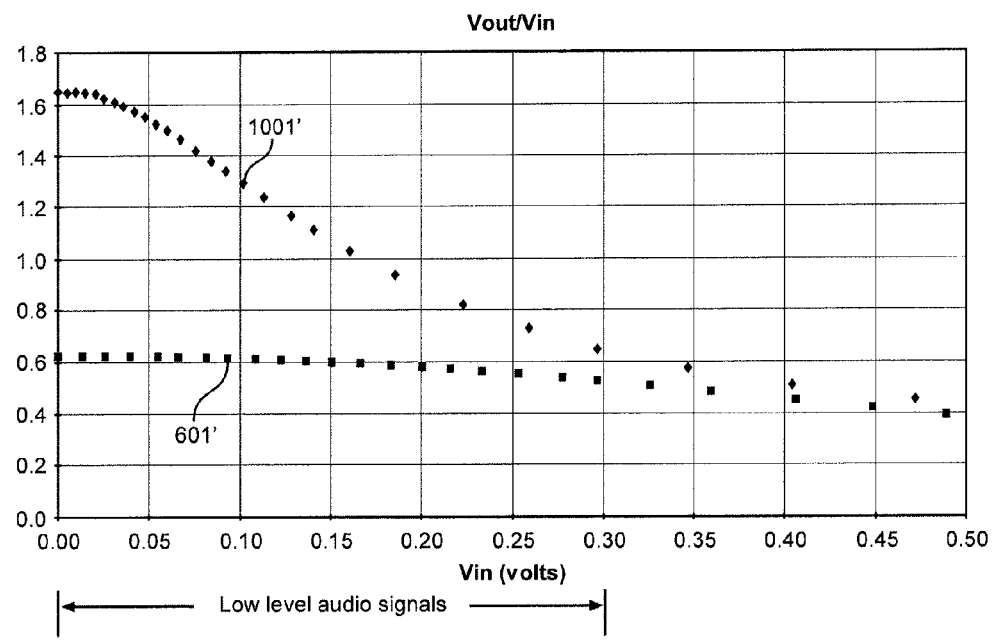
FIG. 13 is a graph of the gain curves for the compressor of FIG. 7 and the compressor of FIG. 1 for low-level audio signal levels.
Figure 14:
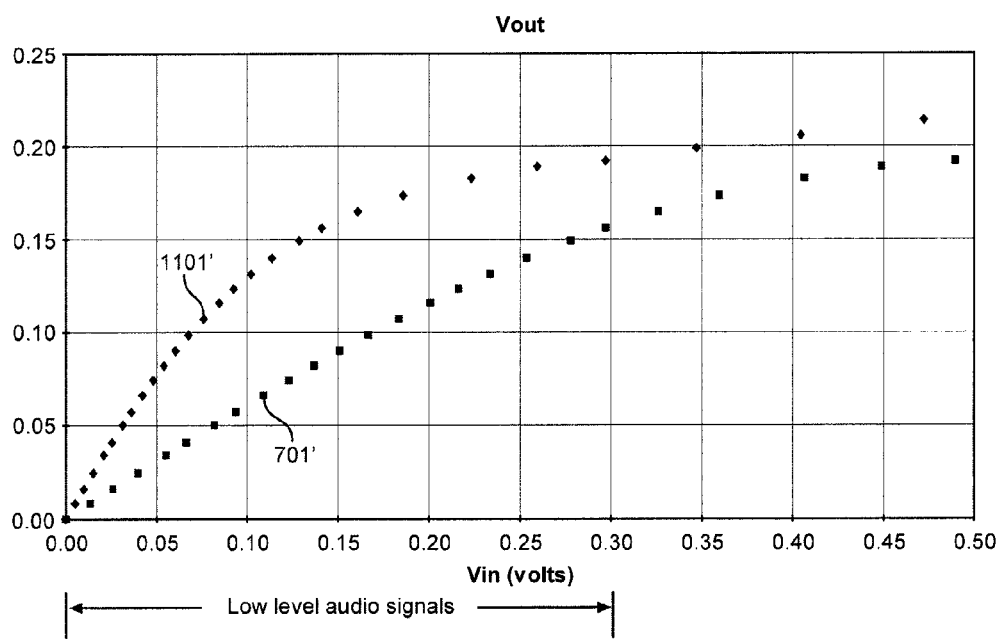
FIG. 14 is a graph of the transfer function curves for the compressor of FIG. 7 and the compressor of FIG. 1 for low-level audio signal levels.

FIG. 13 and FIG. 14 show the differences in signal gain curves and transfer function curves, respectively, for the compressors 115 and 800 for input signal levels below 0.5 volts. Curve 1001' is the portion of the gain curve 1001 for compressor 800 (FIG. 9) for Vin less than 0.5 volts. Curve 601' is the portion of gain curve 601 for compressor 115 (FIG. 5) for Vin less than 0.5 volts. Curve 1101' is the portion of transfer function curve 1101 for compressor 800 (FIG. 10) for Vin less than 0.5 volts. Curve 701' is the portion of transfer function curve 701 for compressor 115 (FIG. 6) for Vin less than 0.5 volts.

The curves of FIGS. 13 and 14 show that the compressor 800 utilizes a change in the lamp filament resistance T to a greater extent than the compressor 115. For a given change in input signal Vin, compressor 800 responds with a signal gain change that is theoretically, inversely proportional to T. Minor limitations such as op-amp open loop gain and lamp wire terminal resistance make it difficult to achieve signal gain changes that are exactly, inversely proportional to T. Nevertheless, the compressor 115 does not utilize filament resistance changes as well as the compressor 800. This aspect of the invention is responsible for the rise in curve 1001' over curve 601' when Vin is decreased. It also causes curves 1101' and 701' to separate then come back together again when Vin is increased from zero, through the range of low-level audio signals and beyond. Curve 1101' illustrates another aspect of the invention that provides high fidelity, professional quality dynamic range compression. Starting at the upper end in the range of low-level audio signals and progressing downward toward Vin=0, note that for a majority of measurement dots of curve 1101' that the remainder of dots to the right of each dot are higher on the graph. This is referred to as an orderly rise in signal gain as Vin decreases. The orderly rise (and other factors such as the attack/release time of the filament) decrease "pumping and breathing" which are engineer jargon words for undesirable audible side effects caused by dynamic range compression.

FIGS. 2 and 8 also show that the operable service life of the lamp filament 111 can be increased through greater utilization of changes in filament resistance. FIG. 9 shows that a useful portion of gain curve 1001 is where Vin ranges from zero and 0.5 volts. The first column of FIG. 8 shows that no light is produced by lamp 100 of compressor 800 for that input signal Vin because the filament 111 is not sufficiently heated. In contrast, the compressor 115 requires a wider range of input signal and greater power dissipation to achieve a useful change in signal gain. Thus, the compressor 115 must illuminate filament 111 to usefully compress the dynamic range of the input audio signal. Therefore, the compressor 800 extends the service life of the lamp 100 because the filament 111 dissipates less power, stays cooler, and has less temperature change in the compressor 800 than in the compressor 115.

Another advantage of greater utilization of changes in filament resistance is less attack/release time to make the automatic volume changes. When compressor 800 is compressing the audio signal, filament 111 is heated and cooled to various temperatures in less time because less power is applied and smaller temperature changes occur. Since the lamp filament resistance T is a function of filament temperature, faster heating and cooling results in less attack/release time to make the automatic volume changes.

Another advantage of greater utilization of changes in filament resistance is that the lamp 100 can be a peak signal indicator. The compressor 800 provides dynamic range compression at input signal levels below the illumination threshold of lamp 100. The compressor 800 can be configured so that only extreme peaks in the input signal level illuminate the lamp 100. In this regard, the type of lamp used for lamp 100 can be pre-selected to match the desired power dissipation and available headroom of the op-amps 806, 807 so that a predetermined level of input signal 801 which causes op-amps 806 or 807 to clip the audio signal also illuminates the lamp 100. When the level of input signal 801 is greater than the predetermined audio signal level, the op-amps 806, 807 will clip output signal 810 and provide sufficient power to illuminate the filament 111 of the lamp 100. When filament 111 illuminates, it provides a visual indication to the user that the level of input signal 801 can be decreased to avoid clipping at the op-amps 806 and 807.

The compressor 800 can include a compression activity indicator 820 that comprises resistors 816, 824, a light emitting diode (LED) 818, a transistor 819, and a terminal 821 connected to a power supply. The values R3, R4 of resistors 816, 822 are predetermined to provide a base voltage at terminal 823 that is greater than the Vbe value of the transistor 819 to turn on the transistor 819 and illuminate the LED 818 when the level of the output signal 810 (Vout) is high enough to have been compressed. This provides a visual activity indicator for the user when compressor 800 is compressing the dynamic range of the audio signal.

Another advantage of greater utilization of changes in filament resistance is that the lamp type plays a greater roll in determining the audio program's tone quality. Each type of lamp has a unique filament resistance curve (example shown in FIG. 3) that is determined by a variety of lamp design and environmental factors. The shape of the filament resistance curve 302 determines the shape of the gain curve 1001 and the transfer function curve 1101 as shown by FIGS. 3, 9 and 10. When the audio program is processed by compressor 800, the program receives a new tone quality that is determined by the curves 1001 and 1101. The greater filament change utilization of the compressor 800 causes the type of lamp used to have a greater impact on the new tone quality.

Figure 15:
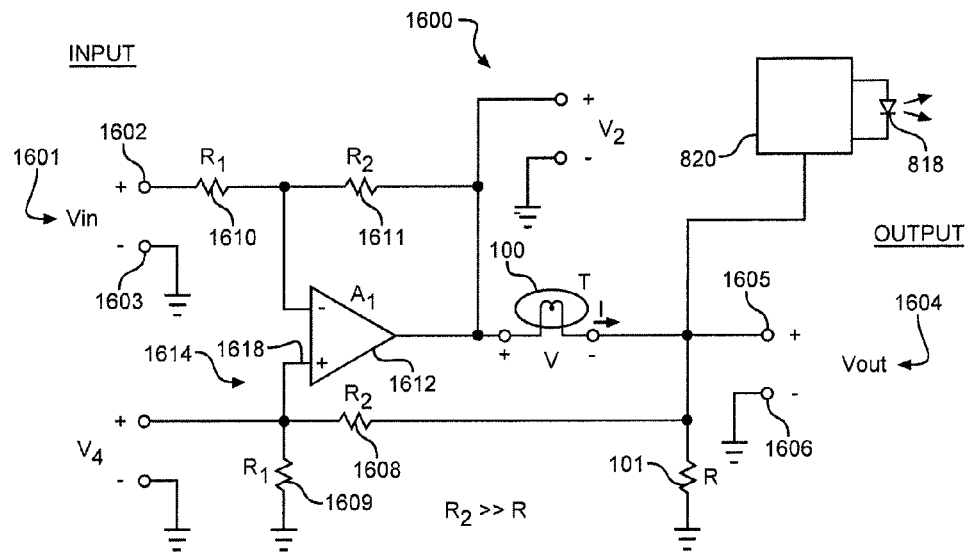
FIG. 15 is a schematic diagram of another embodiment where an audio level compressor has a signal gain controller comprising a load resistor, a lamp and a positive feedback network.

FIG. 15 shows another embodiment of an audio level compressor 1600 that can consume less power. The compressor 1600 has a signal gain controller comprising an incandescent lamp 100; a load resistor 101; resistors 1610, 1611; an operational amplifier 1612, and a means for increasing dynamic range compression. The means for increasing dynamic range compression includes a positive feedback network 1614 comprising resistors 1608,1609 connected to a non-inverting input 1618 of the operational amplifier 1612. Lower power consumption can be achieved because compressor 1600 can provide higher input impedance with only one op-amp. The compressor 1600 can also include the compression activity indicator 820.

In one embodiment, the resistors 1609 and 1610 can have a resistance of R1 ohms; the resistors 1608 and 1611 can have a resistance of R2 ohms; the lamp 100 can have a filament resistance of T ohms; and the resistor 101 can have a resistance of R ohms. In operation, an input audio signal Vin is applied to input terminals 1602, 1603 and an output audio signal Vout is produced at output terminals 1605, 1606.

To eliminate an "R+T" factor from the transfer function, the positive feedback network 1614 applies a portion of the output signal Vout to the non-inverting input of the operational amplifier 1612. To simplify the derivation of the transfer function for the compressor 1600, the resistance R2 is made significantly greater than the resistance of R as indicated by "R2>>R". A resistance for R2 of 10 times R or greater is adequate for practical applications but a resistance of at least 100 times R is preferred. For the compressor 1600, we can derive:

$$Vout = V2 \frac{R}{R+T} \tag{5}$$

which can be rewritten as:

$$V2 = Vout \frac{R+T}{R}, \tag{6}$$

and we can also derive $$V4 = Vout \frac{R1}{R1+R2} \tag{7}$$

The transfer function for the compressor 1600 can then be derived as follows:

$$V2 = -Vin \frac{R2}{R1} + V4 \frac{R1+R2}{R1}, \tag{8}$$

and substituting for V4 using equation (7) gives:

$$V2 = -Vin \frac{R2}{R1} + \left(Vout \frac{R1}{R1+R2}\right) \frac{R1+R2}{R1} = -Vin \frac{R2}{R1} + Vout, \tag{9}$$

and substituting for V2 using equation (6) gives:

$$Vout \frac{R+T}{R} = -Vin \frac{R2}{R1} + Vout \tag{10}$$

Bringing both Vout terms to the same side of the equation and simplifying gives:

$$Vout \frac{T}{R} = -Vin \frac{R2}{R1} \tag{11}$$

which can be rearranged to provide the transfer function:

$$\frac{Vout}{Vin} = -\frac{R2}{R1} \frac{R}{T} \tag{12}$$

The transfer function (12) for compressor 1600 is similar to the transfer function (4) for compressor 800, with the exception of a phase reversal as indicated by the minus sign. FIGS. 8, 9 and 10 also apply to compressor 1600.

Figure 16:
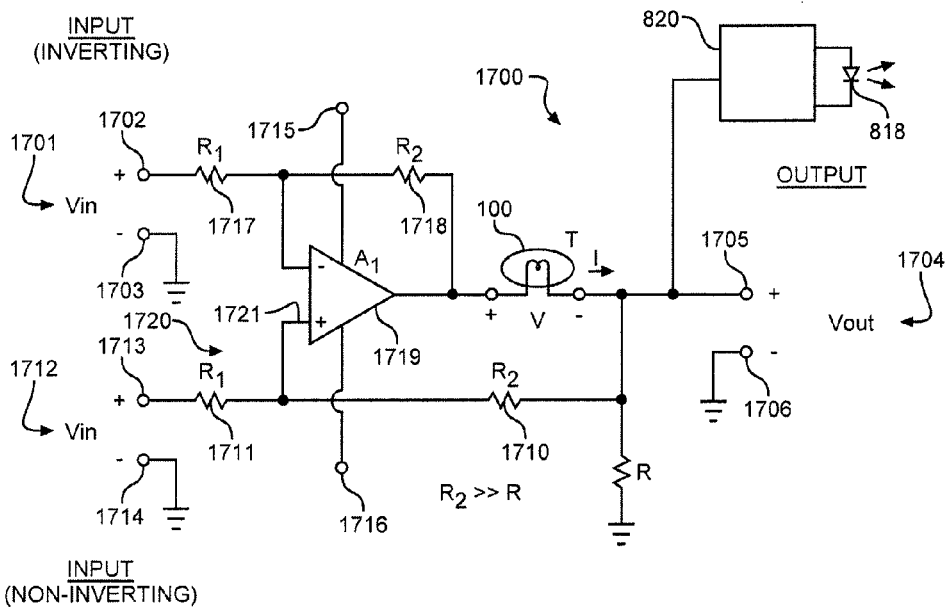
FIG. 16 is a schematic diagram of another embodiment where an audio level compressor has a signal gain controller comprising a load resistor, a lamp and a positive feedback network (This embodiment can operate in one of three modes; a non-inverting mode, an inverting mode, and a differential mode)

FIG. 16 shows another embodiment of an audio level compressor 1700 that has a differential input and can consume less power. The compressor 1700 has a signal gain controller comprising an incandescent lamp 100; a load resistor 101; resistors 1717 and 1718; an operational amplifier 1719, and a means for increasing dynamic range compression. The means for increasing dynamic range compression includes a positive feedback network 1720 comprising resistors 1711, 1710 connected to a non-inverting input 1721 of the operational amplifier 1719. Lower power consumption can be achieved because the compressor 1700 can provide higher input impedance and can accept a differential input signal with only one op-amp. The compressor 1700 can include a compression activity indicator 820. Compressor 1700 is preferred for accepting and compressing an audio signal produced by a microphone that produces a balanced audio signal.

The resistors 1717 and 1711 have a resistance of R1 ohms; the resistors 1718 and 1710 have a resistance of R2 ohms; the lamp 100 has a filament resistance of T ohms; and the resistor 101 has a resistance of R ohms. The compressor 1700 has two audio inputs, a negative Vin input at input terminals 1702, 1703 and a positive Vin input at input terminals 1713, 1714. In operation, a power supply voltage is applied to power terminals 1715 and ground terminal 1716; input audio signals are applied to one or both sets of audio input terminals; and an output audio signal Vout is produced at output terminals 1705, 1706.

The power supply voltage applied to terminals 1715, 1716 can be provided by a bipolar power supply such as two batteries connected in series. The plus terminal of one battery provides a positive power supply voltage; the minus terminal of the other battery provides a negative power supply voltage; and the two battery terminals connected together provide a ground reference. Alternatively, the power supply voltage can be provided by a single power supply that provides a positive voltage and a ground reference potential. A single power supply can be a battery or a power conditioning circuit that conditions power from a phantom power supply. When a single power supply is used, electrical components are added to compressor 1700 for providing DC bias voltage for op-amp 1719; and DC blocking capacitors are added to prevent the DC bias voltage from interfering with other devices connected to the input and output terminals of compressor 1700.

Compressor 1700 has three possible transfer function equations depending on which set of audio input terminals is used. When negative Vin terminals 1702, 1703 are shorted to each other (shunted to ground) and input signal 1712 is applied to positive Vin terminals 1713, 1714, the compressor 1700 operates in a non-inverting mode according to the transfer function:

$$\frac{Vout}{Vin} = \frac{R2}{R1}\frac{R}{T} \quad (13)$$

When positive Vin terminals 1713, 1714 are shorted to each other (shunted to ground) and input signal 1701 is applied to negative Vin terminals 1702, 1703, the compressor 1700 operates in an inverting mode according to the transfer function $$\frac{Vout}{Vin} = -\frac{R2}{R1}\frac{R}{T} \quad (14)$$

For a differential input mode, when input signals 1712 and 1702 are applied to positive Vin terminals 1713, 1714 and negative Vin terminals 1702, 1703, respectively, compressor 1700 operates in a differential mode according to the transfer function:

$$\frac{Vout}{Vin_+ - Vin_-} = \frac{1}{2}\frac{R2}{R1}\frac{R}{T} \quad (15)$$

FIG. 17 shows another embodiment in a cut-away view where a stage microphone 1800 has a compressor circuit board 1807, a transformer 1806, a 3-pin male XLR connector 1805, a mute switch 1804, and a transducer 1801 for converting acoustic energy to an audio signal. The microphone 1800 includes a body 1803 having an input end 1818 and an output end 1819. A windscreen 1802 is located at the input end 1818. The connector 1805 is located at the output end 1819, inside the body 1803, where it can connect to a 3-pin female XLR connector 1808. The compressor circuit board 1807 can be located inside the windscreen 1802 or inside the body 1803. Alternatively, the compressor circuit board 1807 can include a plurality of circuit boards located inside the windscreen 1802 and the body 1803.

In operation, the transducer 1801 converts sound to an audio signal. The circuit board 1807 can include the compression circuit 1700 (FIG. 16) which receives the audio signal and compresses it to produce an output audio signal. The transformer 1806 receives the output audio signal from the compressor circuit board 1807, converts it to a balanced output audio signal, and applies it to the male connector 1805. The female connector 1808 and a microphone cable 1809 send the balanced output audio signal to a mixing console 1810. A power amplifier 1812 receives a signal from the mixing console 1810 and provides a drive signal for a loudspeaker 1811 which produces sound.

The transformer 1806 can also receive phantom power from the mixing console 1810 through the cable 1809 and connectors 1808, 1805 for the circuit board 1807. The transformer 1806 can be omitted when an unbalanced output audio signal is preferred. In that case, the circuit board 1807 can be connected directly to the male connector 1805, and a battery 1813 can be located inside the body 1803 to provide power to the circuit board 1807.

A mute switch 1804 can be connected to pins 2 and 3 of the connector 1805 to create a short circuit between the pins when the switch is switched to the "mute" position. The mute switch 1804 is omitted when a mute function is not desired.

The lamp 100 can be located in a hole in body 1803 to provide a peak signal indicator. The LED 818 can be located in another hole in body 1803 to provide an indicator for compression activity.

The embodiment of the microphone 1800 has a directional pickup pattern to decrease unwanted audio feedback. Nevertheless, audio feedback can still occur when the microphone user walks around the stage. The compressor circuit inside the microphone 1800 provides more protection against accidental overload when audio feedback occurs.

Figure 18:
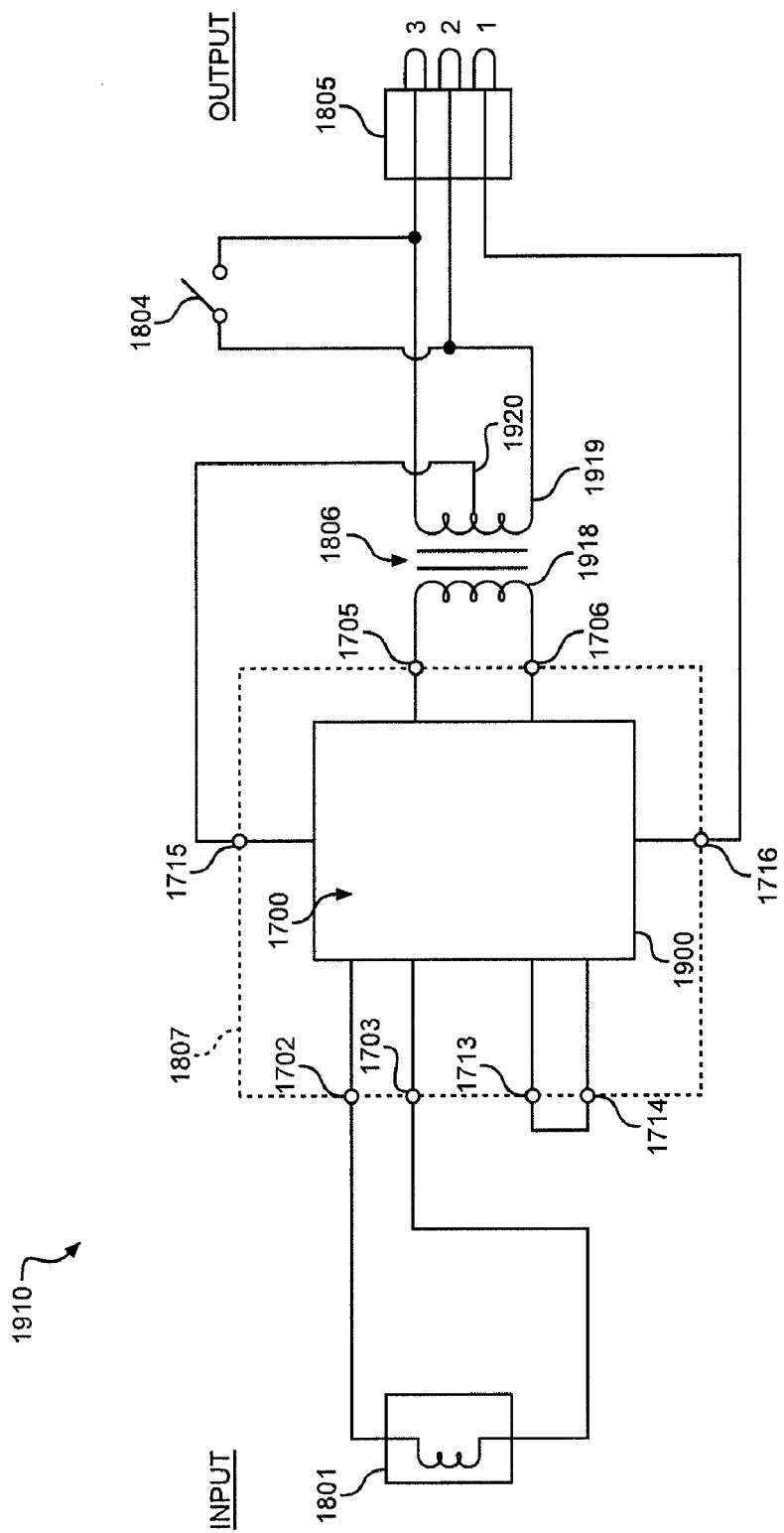
FIG. 18 is a schematic diagram of microphone circuit that includes a compressor, a transducer, a mute switch, and a transformer and a connector for providing a balanced output audio signal and receiving phantom power.

FIG. 18 shows a schematic diagram of a microphone circuit 1910 that can be used in the microphone 1800. The circuit board 1807 comprises a circuit 1900 that includes compressor 1700 (FIG. 16) plus other electrical components such as DC blocking capacitors and resistors for providing DC bias levels. The transducer 1801 applies the audio signal Vin- to the input terminals 1702, 1703 and the compressor 1700 operates in the inverting mode. The transformer 1806 receives output signal Vout from the compressor 1700 and converts it to the balanced output audio signal which is applied to the male connector 1805. The mute switch 1804 is used to mute the output signal when desired. The transformer 1806 has a primary winding 1918 and a secondary winding 1919 with a center tap 1920. The primary winding 1918 is connected to the terminals 1705, 1706 to receive output signal Vout from the compressor 1700. The secondary winding 1919 is connected to terminals 2, 3 of the connector 1805 to send the balanced output audio signal to the connector 1805 and to receive the phantom power from the connector 1805. The center tap 1920 is connected to terminal 1715 to send the phantom power to the compressor 1700. The transformer 1806 blocks the DC voltage of the phantom power from entering terminals 2,3 and it passes the AC output signal Vout from winding 1918 to winding 1919.

FIG. 19A shows a cut-away view of an embodiment of an in-line audio level compressor 2000 that reveals a 3-pin female XLR connector 2001 which connects to a 3-pin male XLR connector 2002, a compressor circuit board 2005, a transformer 2006, and a 3-pin male XLR connector 2007 which connects to connector 1808. The in-line compressor 2000 has a body 2004 with the connector 2001 located at an input end 2011 and the connector 2007 located at an output end 2012; both connectors 2001 and 2007 being located inside of the body 2004.

In operation, an audio signal is produced by an audio signal source such as a stage microphone or a musical instrument (not shown) connected to a microphone cable 2003 having a connector 2002. The connector 2002 connects to the connector 2001 of the in-line compressor 2000 to apply the audio signal to the compressor circuit board 2005. The circuit board 2005 includes an in-line compression circuit (an exemplary embodiment shown in FIG. 20) which receives the audio signal and compresses it to produce an output audio signal. The transformer 2006 receives the output audio signal from circuit board 2005, converts it to a balance output audio signal, and applies it to the connector 2007 of the in-line compressor 2000. A connector 1808 of another microphone cable 1809 connects to the connector 2007 and sends the balance output audio signal to the mixing console 1810. It should be noted that the compressor 2000 can be connected directly to the audio signal source or to the mixing console without additional connectors or cables, for example by using the 3-pin type XLR connectors.

The transformer 2007 can receive phantom power for the circuit board 2005 from the mixing console 1810 through the cable 1809 and the connectors 1808, 2007. The lamp 100 can be located in a hole in the body 2004 to provide a peak signal indicator. The LED 818 can be located in another hole in body 2004 to provide an indicator for compression activity.

Figure 20:
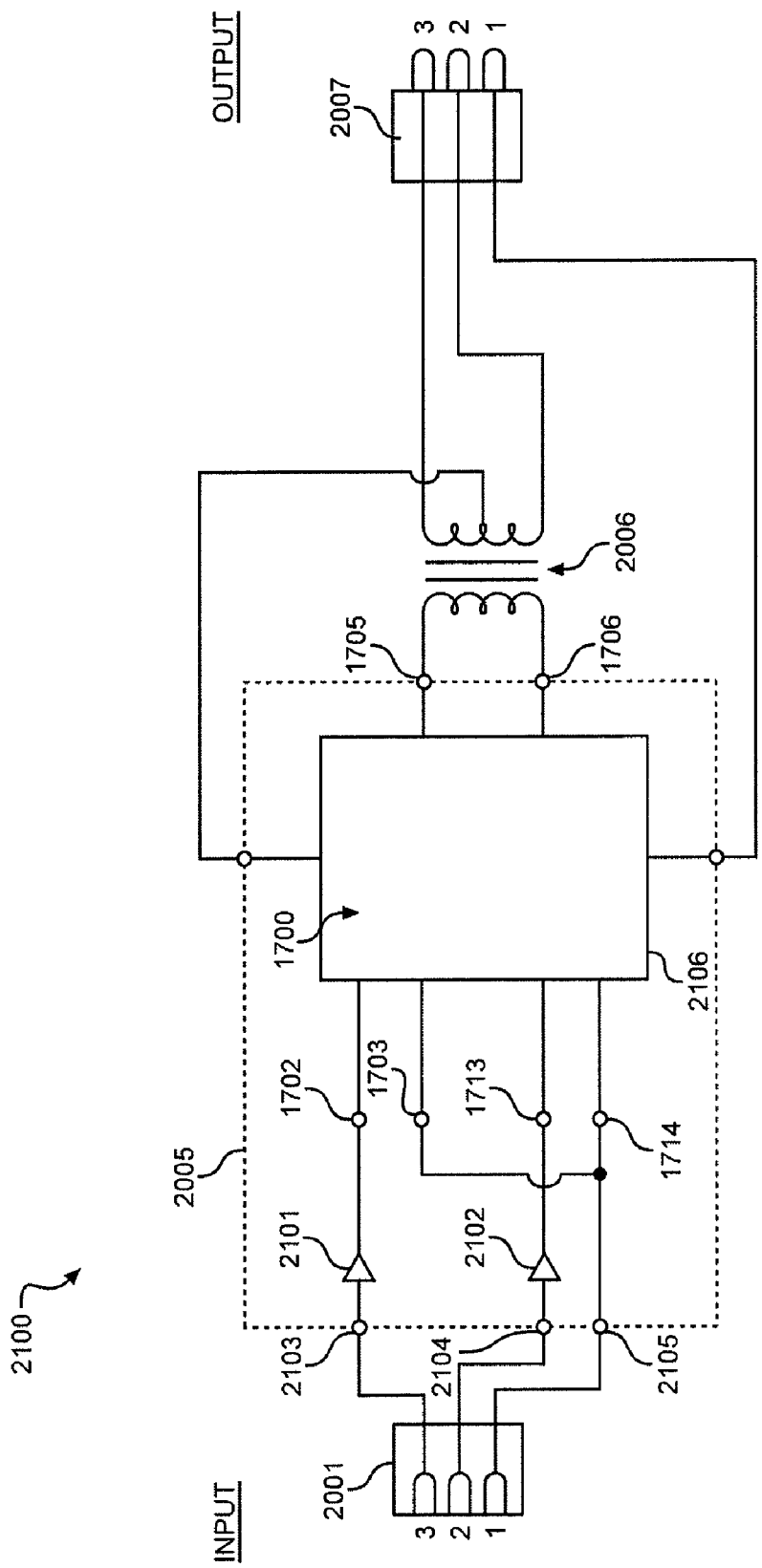
FIG. 20 is a schematic diagram of an in-line compressor circuit that includes a compressor, a connector for receiving an audio signal, a transformer, and a connector for providing a balanced output audio signal and receiving phantom power.

FIG. 20 shows a schematic diagram of an in-line compressor circuit 2100 that can be used for the in-line compressor 2000. The circuit board 2005 comprises unity gain buffers 2101, 2102; and a circuit 2106 that includes compressor 1700 of FIG. 16 plus other electrical components such as DC blocking capacitors and resistors for providing DC bias levels. The connector 2001 applies the input audio signal to the buffers 2101, 2102 which provide a high input impedance (600 ohms or more) to the audio signal source, a low output impedance (100 ohms or less) to the compressor 1700, and a signal gain of one. The compressor 1700 operates in the differential mode. The transformer 2006 receives the output audio signal from the compressor 1700 and converts it to the balanced output audio signal which is applied to the connector 2007.

Figure 21A:
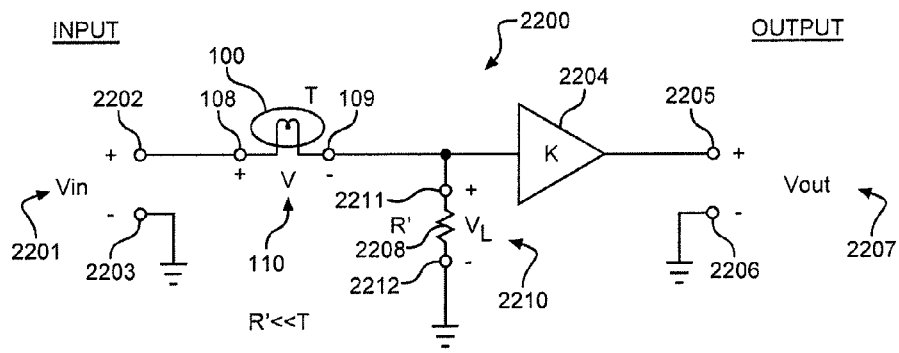
FIG. 21A is a schematic diagram of an embodiment of an audio level compressor that has a signal gain controller comprising an incandescent lamp having a filament with a filament resistance, a load resistance, and a post-compression amplifier having a signal gain of K.

FIG. 21A shows an embodiment of an audio level compressor 2200 that has a signal gain controller comprising the incandescent lamp 100, a load resistor 2208, a post-compression amplifier 2204 having a signal gain of K, and a means for increasing dynamic range compression. The lamp 100 has a filament resistance of T ohms, and the resistor 2208 has a resistance of R' ohms. The means for increasing dynamic range compression includes filament resistance R' being substantially greater than load resistance T'. As such, a difference between the compressor 2200 and the compressor 115 is the resistance value R' of the resistor 2208. To approximate the transfer function with a "T" factor in the denominator instead of an "R'+T" factor:

$$\frac{Vout}{Vin} = K\frac{R'}{R'+T} \approx K\frac{R'}{T} \quad (16)$$

the resistance T of the lamp filament must be greater than the resistance R' as indicated by T>>R' for all values of T regardless of the level of Vin. The resistance T is substantially greater than the resistance R' when the ratio T0/R' of the compressor 2200 is sufficiently more than the ratio T0/R of the compressor 115 to provide at least one of the following benefits; reduced clipping of the audio signal by a power amplifier, more protection against accidental overload, greater compression of the audio signal dynamic range, increased operable service life of the lamp filament, or decreased attack/release time of the automatic volume changes. T0 is the cold resistance of the lamp filament measured at room temperature with an ohmmeter when no filament voltage is applied. In equation 16, the filament resistance T is substantially greater than the load resistance R' when equation 16 closely approximates equation 4 and provides superior gain for low-level audio signals as shown in FIG. 14.

In operation, an input audio signal Vin is applied to input terminals 2202, 2203, and an output audio signal Vout is produced at output terminals 2205, 2206. An amplifier 2204 amplifies a load voltage 2210 by a factor of K in order to boost the output audio signal Vout to a greater level. The voltage 2210 is attenuated by a ratio approximately equal to R'/T0.

The amplifier 2204 compensates the attenuation in order to make the gain curves of compressors 2200 approximately the same as the gain curves of compressors 800. In practice, the lamp filament resistance T can be at least 10 times the load resistance R' for equation 16 to closely approximate equation 4. Other ratios (greater than 10 or less than 10) can be employed provided that the compressor has a signal gain that approaches being inversely proportional to the filament resistance T, this is especially apparent for low-level audio signals. This performance aspect can be verified by applying a predetermined high level input signal to the compressor and recording the output signal level, and then incrementally decreasing the input signal while recording the output signal levels. A graph of the measurements, like the graph shown in FIG. 14, will show that compressors where the signal gain approaches being inversely proportional to the filament resistance 1/T, will have a significantly higher Vout than compressors where the signal gain is inversely proportional to the sum of the filament resistance with a comparable resistance 1/(R+T). The compressor modeled with gain 1/(R+T) is the lower curve and the compressor modeled with gain 1/T is the upper curve. When properly scaled, the two curves should intersect at the origin of the graph (0, 0) and move apart at low level audio signals then get closer together again at higher level audio signals.

Figure 21B:
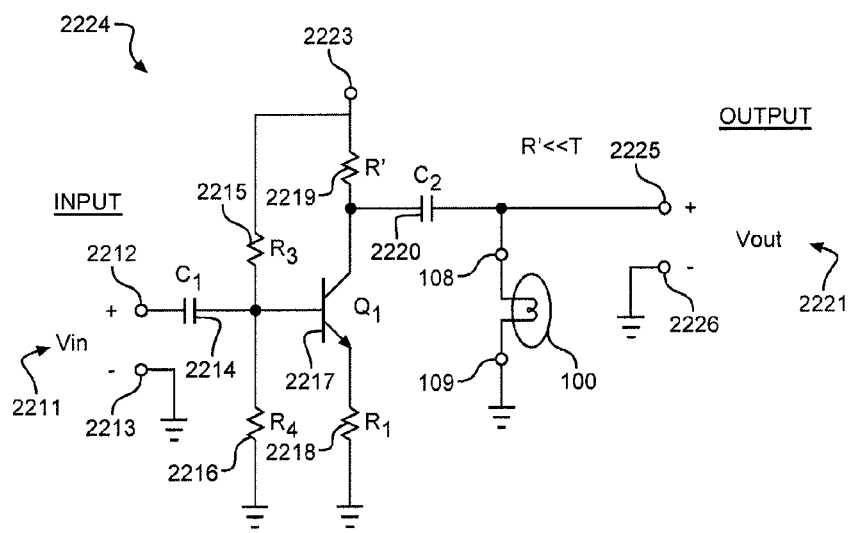
FIG. 21B is a schematic diagram of an embodiment of an audio level compressor comprising a signal gain controller that includes an incandescent lamp, a load resistance.

FIG. 21B shows an embodiment of an audio level compressor 2224 comprising a signal gain controller that includes the incandescent lamp 100, a load resistor 2219, a resistor 2218, and a means for increasing dynamic range compression which includes load resistance R' being substantially less than filament resistance T'. As such, lamp 100 has a filament resistance of T ohms, resistor 2219 has a resistance of R' ohms, and resistor 2218 has a resistance of R1 ohms. In order to approximate the transfer function with:

$$\frac{Vout}{Vin} \approx \frac{1}{R1}\frac{R'}{T} \quad (17)$$

which does not have an "R'+T" factor in the denominator, the filament resistance T must be substantially greater than the resistance R' as indicated by T>>R' for all values of T regardless of the level of Vin.

In operation, a power supply voltage is applied to a terminal 2223 that provides power to the compressor 2224, an input audio signal Vin is applied to input terminals 2212, 2213, and an output audio signal Vout is produced at output terminals 2225, 2226. A transistor Q1 amplifies the audio signal, and a capacitor C2 blocks DC and passes the audio signal to the lamp 100.

Figure 22:
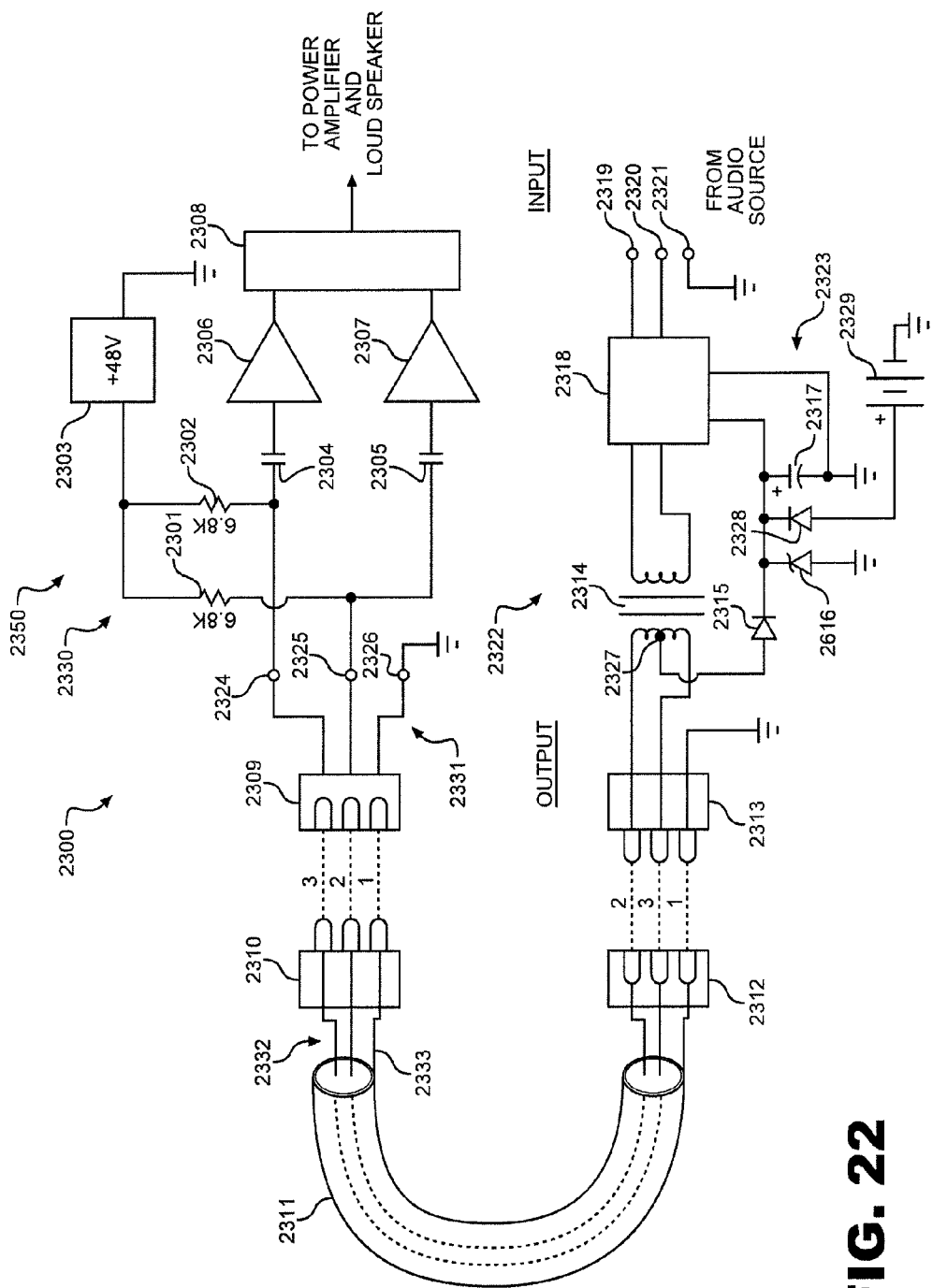
FIG. 22 is a schematic diagram of a mixing console preamplifier, a phantom power supply, a remote audio level compressor having a power conditioning circuit, and a microphone cable with connectors for providing phantom power from the phantom power supply to the remote compressor, and for providing a compressed output audio signal from the remote compressor to the mixing console preamplifier.

FIG. 22 shows an audio circuit 2300 comprising a preamplifier 2330 of a mixing console, a remotely locatable audio compressor 2322, and a microphone cable 2311. The audio level compressor 2322 can be located a predetermined distance from the preamplifier 2330. The preamplifier 2330 includes input terminal 2324, 2325, 2326; a phantom power supply 2303; pull-up resistors 2301, 2302; DC blocking capacitors 2304, 2305; amplifiers 2306, 2307; a 3-pin female XLR connector 2309; and other circuits 2308. The compressor 2322 includes a 3-pin male XLR connector 2313; a transformer 2314; a compressor circuit board 2318 (for example, compressor circuit board 2005 of FIG. 19A); input terminals 2319, 2320, 2321; and a power conditioning circuit 2323 comprising the transformer 2314, a diode 2315, a diode 2616, and a capacitor 2317. The microphone cable 2311 can be a twisted, shielded pair of wires 2332, an electrostatic shield 2333, a 3-pin male XLR connector 2310, and a 3-pin female XLR connector 2312. The microphone cable 2311 connects the connector 2309 of the preamplifier 2330 with the connector 2313 of the audio compressor 2322. The maximum distance between the compressor 2322 and the preamplifier 2330 is determined by the length of the cable 2311.

The compressor 2322 can be located inside the microphone body 1803 (FIG. 17) or it can be located inside the in-line compressor body 2004 (FIG. 19A). When located inside the microphone body 1803, the input terminals 2319, 2320 are connected to the transducer 1801 and the terminal 2321 can be connected to the body 1803 to provide a ground reference potential. When located inside in-line compressor body 2004, the input terminals 2319, 2320, 2321 are connected to the connector 2001.

In operation, an audio signal applied to the input terminals 2319, 2320, 2321 is compressed by the compressor circuit board 2318 and a balanced output audio signal is applied to the input terminals 2324, 2325, 2326 of the preamplifier 2330 via the transformer 2314, the connectors 2313, 2312, the cable 2311, and the connectors 2309, 2310. The audio signal then passes through the capacitors 2304, 2305, is amplified by the amplifiers 2306, 2307, and is conditioned by other circuits 2308 to provide an audio signal for a power amplifier and loudspeaker (not shown).

The phantom power supply 2303 provides a DC current to the power conditioning circuit 2323 via resistors 2301, 2302; the terminals 2324, 2325, 2326; the connectors 2309, 2310; the cable 2311 and the connectors 2312, 2313. A center tap 2327 of the transformer 2314 receives the DC current and applies it to the compressor circuit board 2318 via diode 2315 in order to provide power for the circuit board 2318. The Zener diode 2616 and the capacitor 2317 provide voltage regulation to provide a constant DC power supply voltage for the circuit board 2318. The capacitors 2304, 2305 block the DC current from entering the amplifiers 2306, 2307.

The power conditioning circuit 2323 can include a second diode 2328 and a battery 2329 for providing power to the circuit board 2318. The diodes 2315, 2328 are connected so that the circuit board 2318 can receive power from the phantom power supply 2303 or from the battery 2329 or from both simultaneously.

Figure 23A:
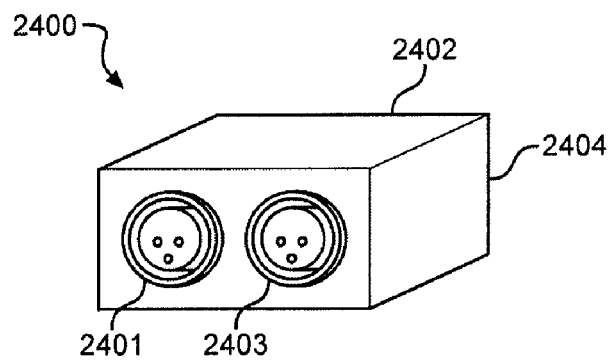
FIGS. 23A, 23B and 23C illustrate three alternate enclosures for an in-line audio level compressor.

FIG. 23 illustrates alternate enclosures for the body 2004. FIG. 23A illustrates an enclosure 2400 which is a rectangular box that has two independent in-line audio level compressors. One in-line compressor has its input connected to a 3-pin female XLR connector 2401 and its output connected to a 3-pin male XLR connector 2402 (not shown). The other in-line compressor has its input connected to a 3-pin female XLR connector 2403 and its output connected to a 3-pin male XLR connector 2404 (not shown).

Figure 23B:
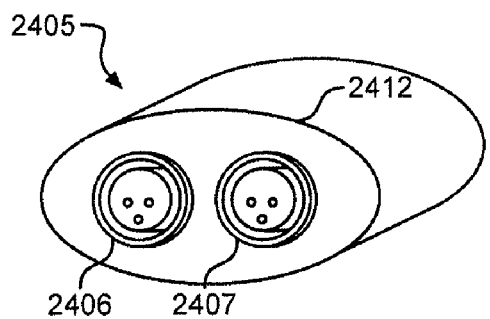

FIG. 23B illustrates an enclosure 2405 having an oval cross-section that encloses an in-line audio level compressor. The compressor's input is connected to a 3-pin female XLR connector 2406 and the compressor's output is connected to a 3-pin male XLR connector 2407. The enclosure 2405 can have a coating of glow-in-the-dark paint 2412 for illumination on a darkened stage.

Figure 23C:
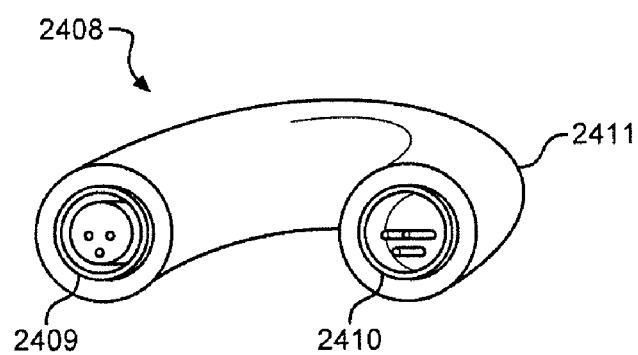

FIG. 23C illustrates an enclosure 2408 having a flexible body 2411 that can be bent into different shapes that encloses an in-line audio level compressor. The compressor's input is connected to a 3-pin female XLR connector 2409 and the compressor's output is connected to a 3-pin male XLR connector 2410.

In alternative embodiments to those disclosed herein, the lamp filament 111 can be replaced by a thermistor having a PTC or NTC property. When a thermistor having a PTC property is used, it can occupy the position in the circuit formerly occupied by the incandescent lamp 100.

When a thermistor having a NTC property is used instead of an incandescent lamp 100 or a PTC thermistor, the NTC thermistor and the load resistor 101 exchange positions in the circuit. For example, the NTC thermistor is placed in the position of the resistor 101 (FIG. 7), and the resistor 101 is placed in the position of the lamp 100. In the embodiment shown in FIG. 7, the NTC thermistor is connected between terminals 109, 808 and the resistor 101 is connected between terminals 108, 109. If an NTC thermistor were to replace the lamp 100 in FIG. 7 and not exchange positions with the resistor 101, the resulting circuit would be an audio level expander instead of a compressor.

Alternate embodiments derived from the compressor 2200 of FIG. 21A have an additional consideration regarding the value R' of the load resistor 2208. In order for the compressor 2200 to provide audio level compression with an NTC thermistor, the NTC thermistor is connected between terminals 2211, 2212 and the load resistor 2208 is connected between terminals 108, 109. To eliminate the "R+T" factor from the transfer function approximation equation, resistance R' is substantially greater than the resistance of T for all values of T regardless of the level of Vin.

FIG. 17A shows an alternate embodiment where the connectors 1808, 1805 are replaced by a strain relief 1815 for the cable 1809. One end of the microphone cable 1809 is terminated by the microphone body 1803, where wires 1817 of the cable 1809 connect inside the microphone body 1803 to the microphone circuit 1910. The remaining end of the microphone cable 1809 is terminated by a 3-pin male XLR connector 1814 for connecting to the mixing console to send the balanced output audio signal to the mixing console.

FIG. 17B shows an alternate embodiment where the remaining end of the microphone cable 1809 is terminated by a ¼ inch phone plug 1816 for connecting to a musical instrument amplifier, such as a guitar amplifier, to send the output audio signal to the instrument amplifier. The battery 1813 provides power to the microphone circuit 1910 because the phantom power supplies can not normally provide power through a ¼ inch phone plug. The transformer 1806 is omitted and the wires 1817 of the cable 1809 connect directly to the circuit board 1807 to provide an unbalanced output audio signal.

FIG. 19B shows an alternate embodiment where connectors 2002, 2001 are replaced by a strain relief 2011 for the cable 2003. At the input end 2011 of the body 2004, the connectors 2002, 2001 are replaced by a strain relief 2021 for the cable 2003. One end of the microphone cable 2003 is terminated by the body 2004, where the wires 2013 of the cable 2003 connect inside of the body 2004 to the in-line compressor circuit 2100. The remaining end of the microphone cable 2003 is terminated by a 3-pin female XLR connector 2009 for connecting to the audio signal source. At the output end 2012 of the body 2004, the connectors 2007, 1808 are replaced by a strain relief 2022 for the cable 1809. One end of the microphone cable 1809 is terminated by the body 2004, where the wires 2014 of the cable 1809 connect inside the body 2004 to the in-line compressor circuit 2100. The remaining end of the microphone cable 1809 is terminated by a 3-pin male XLR connector 2010 for connecting to the mixing console or a phantom power supply.

Figure 24B:
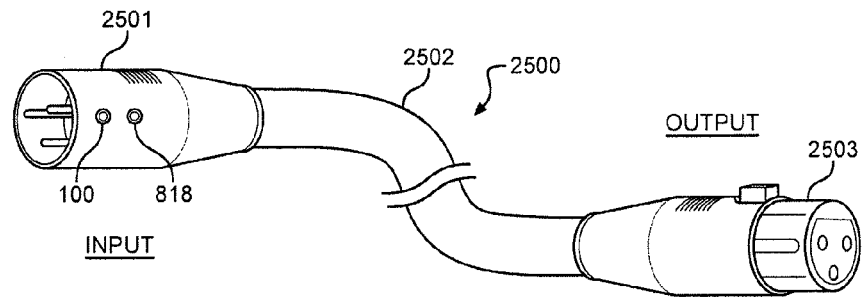
FIGS. 24A and 24B illustrate alternate enclosures for an in-line audio level compressor.
Figure 24A:
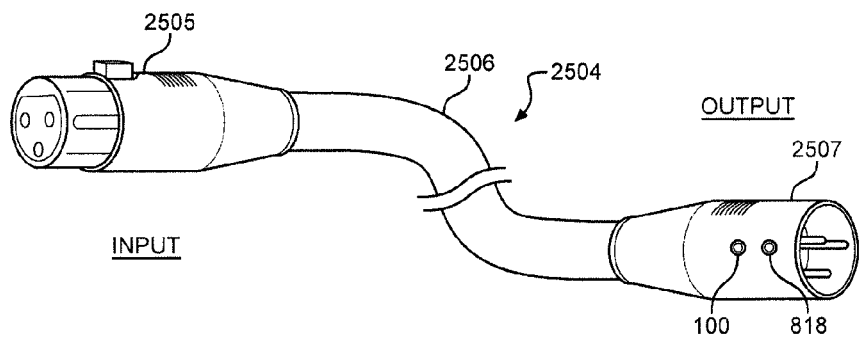

FIG. 24A shows an alternate enclosure 2500 for the in-line audio level compressor 2000 that includes an input 3-pin female XLR connector 2501, a microphone cable 2502, and an output 3-pin male XLR connector 2503. The in-line compressor circuit 2100 is located within the connector 2501 which can be larger than the connector 2503 to contain the circuit components. The connector 2501 can include two holes, one for the lamp 100 and the other for the LED 818, so that their illumination can be viewed from outside the connector 2501.

FIG. 24B shows an alternate enclosure 2504 for the in-line audio level compressor 2000 that includes an input 3-pin female XLR connector 2505, a microphone cable 2506, and an output 3-pin male XLR connector 2507. The in-line compressor circuit 2100 is located within the connector 2507 which can be larger than the connector 2505 to contain the circuit components. The connector 2507 can include two holes, one for the lamp 100 and the other for the LED 818, so that their illumination can be viewed from the outside connector 2507.

Figure 25:
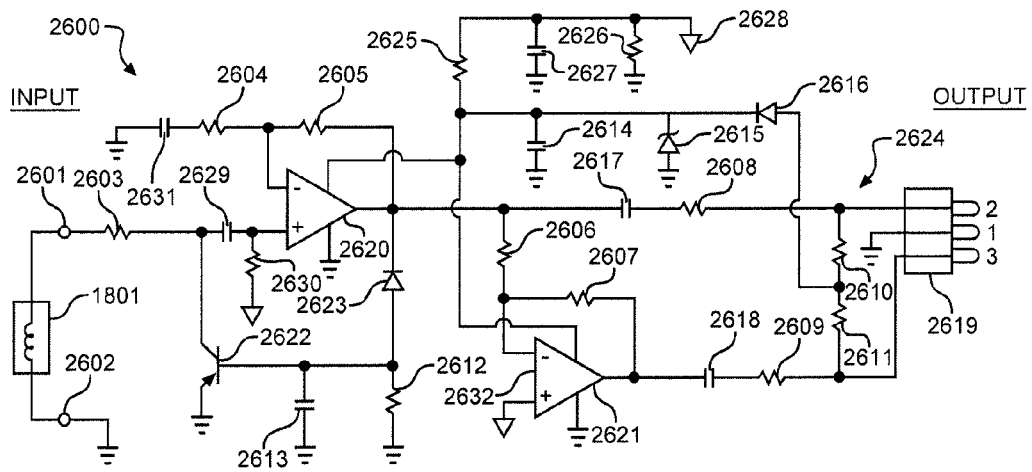
FIG. 25 is a schematic diagram of an alternate embodiment where an audio compressor has a transistor for controlling signal gain.

FIG. 25 shows an alternate embodiment where an audio compressor 2600 has a transistor 2622 for controlling signal gain. The compressor 2600 can be located inside the stage microphone 1800 (replacing the circuit board 1807 and the transformer 1806). The audio signal from the transducer 1801 is applied to the compressor 2600 via input terminals 2601, 2602 where it is amplified by an op-amp 2620. A diode 2623, a resistor 2612, and a capacitor 2613 convert the output audio signal of the op-amp 2620 to a DC control voltage which is applied to the transistor 2622. When the output audio signal reaches a predetermined level, the transistor 2622 turns on and decreases the input audio signal to the op-amp 2620. This limits the output audio signal to the predetermined level to compress the dynamic range of the output audio signal. The compressor 2600 can be referred to as a limiter because it limits the maximum output audio signal level to the predetermined level.

The compressor 2600 has a power conditioning circuit 2624 comprising resistors 2608, 2609, 2610, 2611, a diode 2616, a Zener diode 2615, and capacitors 2614, 2617, 2618. The power conditioning circuit 2624 provides power to op-amps 2620 and 2621 from a phantom power source (not shown) connected to a 3-pin male XLR connector 2619. The resistors 2610, 2611, the capacitor 2614, and the diode 2616 separate the DC voltage from the output audio signal and provide the DC voltage to the op-amps 2620 and 2621. The Zener diode 2615 regulates the DC voltage to a predetermined level. The capacitors 2617, 2618 are DC blocking capacitors that prevent the phantom power supply's DC voltage from entering the outputs of the op-amps 2620, 2621; but the capacitors 2617, 2618 allow the output audio signal from the op-amps 2620, 2621 to pass through to the mixing console via the resistors 2608, 2609 and the connector 2619. The power conditioning circuit 2624 passes output signals (from the output terminals of op-amps 2620 and 2621) to connector 2619, block DC phantom power from entering the output terminals of op-amps 2620 and 2621, and passes the DC phantom power to diodes 2616 and 2615 in order to provide power for operating compressor 2600.

It should be noted that the power conditioning circuit 2624 (which does not have a transformer) can be interchanged with any of the other power conditioning circuits (that do have a transformer). Resistors 2625, 2626 and a capacitor 2627 provide a floating ground voltage 2628 for biasing the op-amps 2620 and 2621. The op-amp 2620 is DC biased by a resistor 2630 and DC blocking capacitors 2629, 2631. The op-amp 2621 is biased by a direct connection between its non-inverting input 2632 and the floating ground voltage 2628.

FIG. 26A illustrates a cut-away view and FIG. 26B shows an exemplary circuit diagram for an alternate embodiment where an in-line phantom power adaptor 2700 can provide power to a compressor inside a stage microphone (not shown) or to an in-line compressor (not shown) when a mixing console (not shown) does not have a phantom power supply. In operation, a female XLR connector 2706 is connected to the microphone or in-inline compressor via a male XLR connector 2703 and connected to a microphone cable 2702. A male XLR connector 2707 is connected to the mixing console via a female XLR connector 2704 connected to another microphone cable 2705. It should be noted that the adaptor 2700 can be connected directly to the microphone, in-line connector, or mixing console without additional connectors or cables.

The adaptor 2700 includes a 9-volt battery 2708 that provides a DC voltage to the microphone or in-line compressor via terminals 2710, 2711 and resistors 2712, 2714, 2715. A capacitor 2713 is provided to prevent audio signal crosstalk between pins 2 and 3 of the connectors 2706 and 2707. The battery 2708 can be replaced by a power supply, a DC wall transformer, or an AC adaptor wherein the capacitor 2713 filters AC noise and hum out of the power supply voltage when the battery 2708 is replaced by the AC adaptor. Capacitors 2718, 2719 and diodes 2720, 2721 block the DC voltage (from the battery or power supply) from entering the input terminals of the mixing console. The diodes 2720, 2721 are included for when the adaptor 2700 is accidentally connected to a mixing console having a phantom power supply. In that case, the diodes 2720, 2721 are forward biased by the phantom power supply's voltage and pass the phantom voltage to the microphone or in-line compressor.

Figure 27:
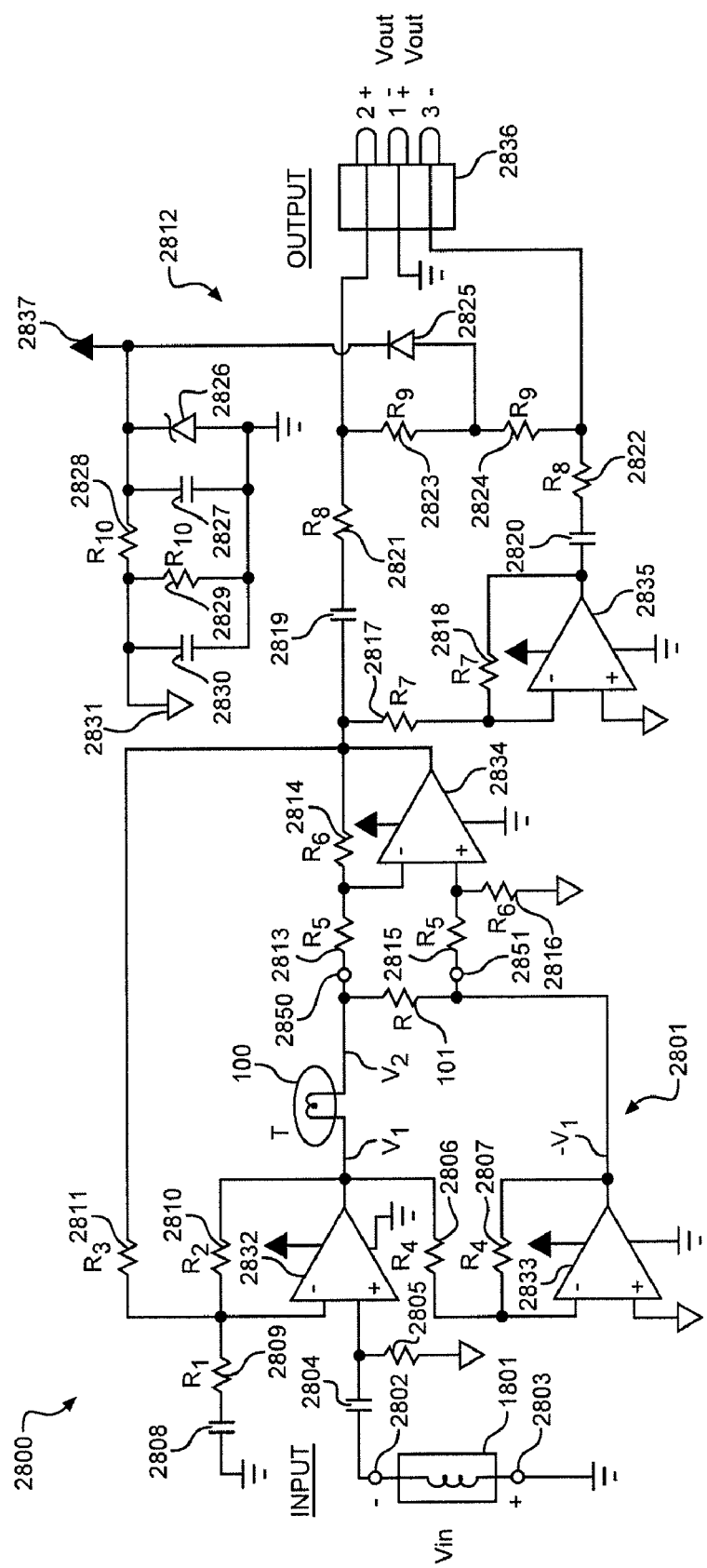
FIG. 27 is a schematic diagram of an alternate embodiment where an audio level compressor having a push-pull lamp driver for operating on a low voltage power supply.

FIG. 27 shows an alternate embodiment of an audio level compressor 2800 that can operate with a lower-voltage DC supply voltage 2837. The compressor 2800 has a push-pull lamp driver 2801 comprising op-amps 2832, 2833 for providing greater drive voltage to the lamp 100 and the load resistor 101 for the given DC supply voltage 2837 and the op-amp type. The signal gain controller includes op-amps 2832, 2833; lamp 100 having filament resistance T; load 101 having load resistance R; and a means for increasing dynamic range compression which includes an op-amp 2834 for providing an output audio signal and resistor 2811 for providing a portion of the output audio signal to an input of the signal gain controller. The compressor 2800 can be located inside the stage microphone 1800 (replacing circuit board 1807 and transformer 1806). In operation, the input audio signal provided by the transducer 1801 is applied to the compressor 2800 via input terminals 2802, 2803 where it is amplified by the push-pull driver 2801. The driver 2801 provides two drive signals V1 and V2 to the lamp 100 and load resistor 101 which are wired in series. The drive signal V1 is in-phase with the input audio signal and the drive signal V2 is out-of-phase with respect to the input audio signal. The op-amp 2834 is configured as a differential amplifier comprising resistors 2813, 2814, 2815, and 2816 to provide a compressed output audio signal for a male XLR connector 2836. The differential amplifier 2834 has an inverting input terminal 2850 and a non-inverting input terminal 2851. The resistor 101 is connected between terminals 2850, 2851 so that the differential amplifier cancels the two drive signals V1 and V2 from the output audio signal. A resistor 2811 provides a positive feedback path for feeding a portion of the output audio signal to the input of the push-pull driver 2801 to increase the dynamic range compression.

The transfer function for the compressor 2800 can be derived as follows. The value of Vout can be expressed in terms of the lamp terminal voltages as:

$$Vout = -V2\frac{R6}{R5} + (-V1)\frac{R6}{R5} \qquad (18)$$

The voltage V2 can be expressed in terms of V1 as:

$$V2 = V1\frac{R}{R+T} + (-V1)\frac{T}{R+T} = V1\frac{R-T}{R+T} \qquad (19)$$

Using equation (19) to substitute for V2 in equation (18) provides:

$$Vout = \left(-V1\frac{R-T}{R+T}\right)\frac{R6}{R5} - V1\frac{R6}{R5} = -V1\frac{R6}{R5}\frac{2R}{R+T} \qquad (20)$$

The value of V1 can be expressed in terms of Vin and Vout as:

$$V1 = -Vin\frac{R2}{R1} - Vout\frac{R2}{R3} \qquad (21)$$

Using equation (21) to substitute for V1 in equation (20) provides:

$$Vout = \left(Vin\frac{R2}{R1} + Vout\frac{R2}{R3}\right)\frac{R6}{R5}\frac{2R}{R+T}$$

which can be rearranged to put Vin and Vout on opposite sides of the equation as:

$$Vout\left(1 - 2\frac{R6}{R5}\frac{R2}{R3}\frac{R}{R+T}\right) = 2Vin\frac{R6}{R5}\frac{R2}{R1}\frac{R}{R+T}$$

This can be simplified when $$2\frac{R6}{R5}\frac{R2}{R3} = 1 \qquad (22)$$

which yields $$Vout\left(1 - \frac{R}{R+T}\right) = Vout\frac{T}{R+T} = 2Vin\frac{R6}{R5}\frac{R2}{R1}\frac{R}{R+T}$$

which provides the transfer function $$\frac{Vout}{Vin} = 2\frac{R6}{R5}\frac{R2}{R1}\frac{R}{R+T}\bigg/\left(\frac{T}{R+T}\right) = 2\frac{R6}{R5}\frac{R2}{R1}\frac{R}{T} \qquad (22)$$

Note that a "T" factor instead of an "R+T" factor in the denominator of the transfer function is due to the substitution shown in Equation (22) which can be re-expressed as:

$$R3 = 2\frac{R6}{R5}R2$$

where R3 is the resistance value of the resistor 2811. Thus, the resistor 2811 provides positive feedback to provide a "T" factor in transfer function equation (22).

The compressor 2800 also includes a power conditioning circuit 2812 comprising resistors 2821, 2822, 2823, 2824; a diode 2825; a Zener diode 2826; and capacitors 2819, 2820, 2827. The power conditioning circuit 2812 provides power to op-amps 2832, 2833, 2834, 2835 from a phantom power source (not shown) that is connected to the male XLR connector 2836. This is similar to the circuit 2624 (FIG. 25) with one important exception; the Zener diode 2826 (FIG. 27) can have a lower Zener voltage than the Zener diode 2615 (FIG. 25). This enables the compressor 2800 to draw move current from the phantom supply without disrupting the voltage regulation provided to the DC supply voltage 2837 by the Zener diode 2615.

The op-amp 2835 is an inverter for inverting the compressed output audio signal for the connector 2836 so that the connector 2836 can provide a balanced audio signal for the mixing console. Resistors 2828, 2829 and a capacitor 2830 provide a floating ground voltage 2831 for biasing the op-amps 2832, 2833, 2834 and 2835.

Figure 28:
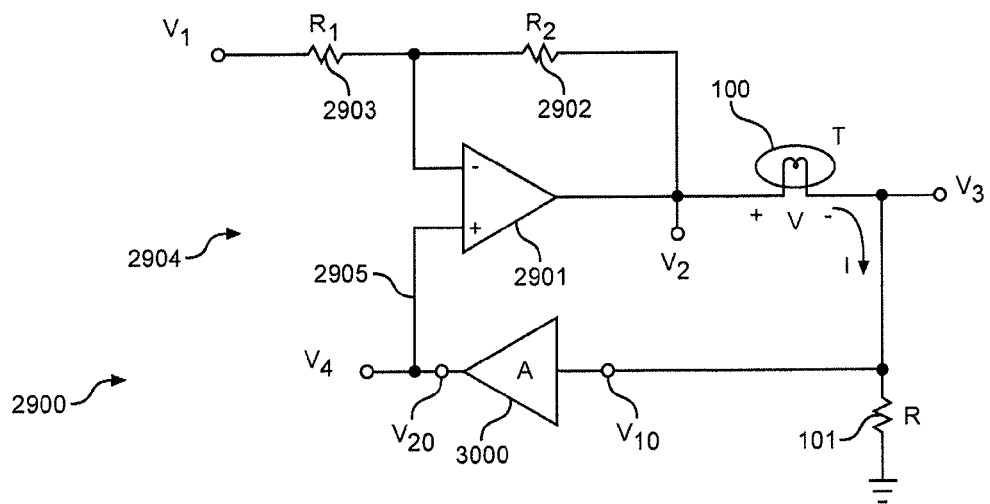
FIG. 28 shows an alternate embodiment of an audio level compressor wherein an adjustable positive feedback amplifier provides a variable portion of the output audio signal to an input of a signal gain controller.

FIG. 28 shows an embodiment of an audio level compressor 2900 having a signal gain controller comprising an amplifier 2904, a lamp 100 with a filament resistance T, and a resistor 101 with a load resistance R, and a means for increasing dynamic range compression. The means for increasing dynamic range compression includes an adjustable positive feedback amplifier 3000 that provides a portion V4 of the output audio signal V3 to an input 2905 of the signal gain controller. The amplifier 2904 comprises an op-amp 2901 and resistors 2902, 2903. The value of voltage V2 can be expressed as:

$$V2 = -V1\frac{R2}{R1} + V3A\frac{R1+R2}{R1} \qquad (23)$$

or alternatively as $$V2 = V3\frac{R+T}{R} \qquad (24)$$

Substituting for V2 in equation 21 the transfer function for compressor 2900 can be expressed as:

$$\frac{V3}{V1} = -\frac{R2}{R1}\left(\frac{R}{T+R\left(1-A\frac{R1+R2}{R1}\right)}\right) \qquad (25)$$

This embodiment provides a family of gain curves where the shape of each curve is dependent on the gain "A" of the amplifier 3000. When A=R1/(R1+R2), the transfer function (25) can be simplified to:

$$\frac{V3}{V1} = -\frac{R2}{R1}\frac{R}{T} \qquad (25)$$

which is the same transfer function equation as compressor 800 (FIG. 7).

Figure 29:
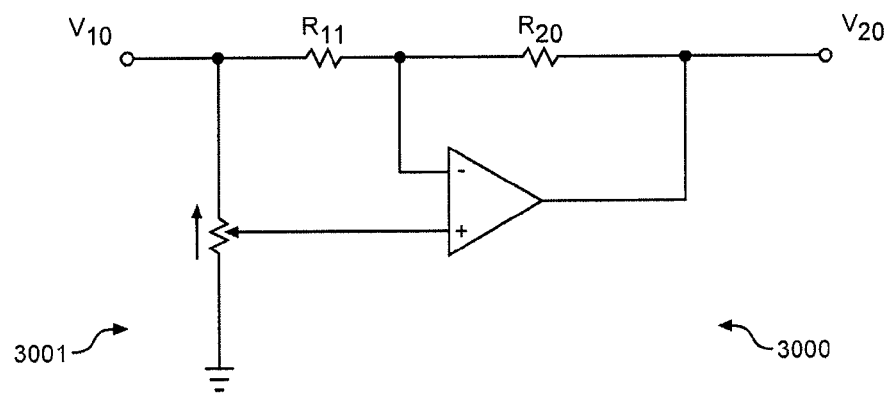
FIG. 29 shows an embodiment of the adjustable positive feedback amplifier of FIG. 28.

FIG. 29 shows an embodiment of the positive feedback amplifier 3000 where a rotary potentiometer 3001 changes the gain "A" of the amplifier 3000. When the potentiometer 3001 is rotated to a full clockwise position (CW):

$$A = \frac{V2}{V1} = \frac{R11 + R20}{R11} - \frac{R20}{R11} = 1$$

providing unity gain. When the potentiometer 3001 is rotated to a full counter-clockwise position (CCW):

$$A = \frac{V2}{V1} = -\frac{R20}{R11}$$

In theory, the potentiometer 3001 can be adjusted to set A to any value between these two limits.

FIG. 30 shows tabulated values of the transfer function (25) of the audio level compressor 2900 for input voltage V1, output voltage V3, compression ratio, and four values of A. Sections W, X, Y and Z of FIG. 30 show the values of input voltage V1, output voltage V3 and compression ratio when A equals 0.65, 0.5, 0.3 and −2.5, respectively. All of these cases set T0=20, R=47.5 and R1=R2. The decibel values for input and output are calculated for each section by the equations V1 (dB)=20*log(V1). All sections use the same output values calculated by V3 (dB)=20*log(V3). Ratios in each section are calculated as the inverse slope of V1 (dB)/V3 (dB) using the equation:

$$\text{Ration} = (V1(dB)_{-2} - V1(dB)_{+2})/(V3(dB)_{-2} - V3(dB)_{+2}),$$

where for a given row of FIG. 30, V1 (dB)$_{-2}$ is the value of V1 (dB) two rows higher, V1 (dB)$_{+2}$ is the value of V1 (dB) two rows lower, V3 (dB)$_{-2}$ is the value of V3 (dB) two rows higher, and V3 (dB)$_{+2}$ is the value of V3 (dB) two rows lower. For example, consider row 28 where Illumination is dim, and in section W, Ratio=(−3.0−2.0)/(−0.7−0.6)=3.8.

Figure 31:
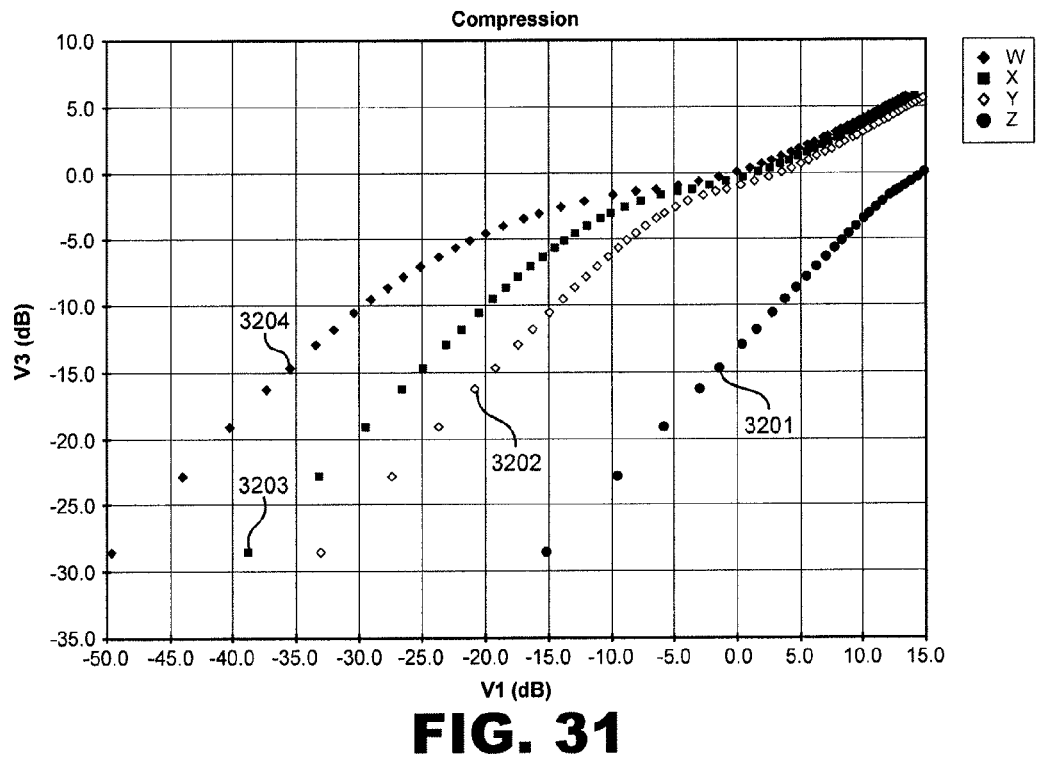
FIG. 31 shows the dynamic range compression at four gain values of the adjustable feedback amplifier.

FIG. 31 shows gain curves 3201-3204 to illustrate that a greater value of "A" makes the compressor 2900 increase dynamic range compression. When A is a relatively low value (A=−2.5), the compressor 2900 decrease dynamic range compression because gain curve 3201 has greater slope. When A is a relatively high value (A=0.65), the compressor 2900 increases dynamic range compression because gain curve 3204 has less slope. Greater dynamic range compression is indicated by a gain curve that has lesser slope (is flatter) than another gain curve when both curves are plotted on a log input-log output graph.

Figure 32:
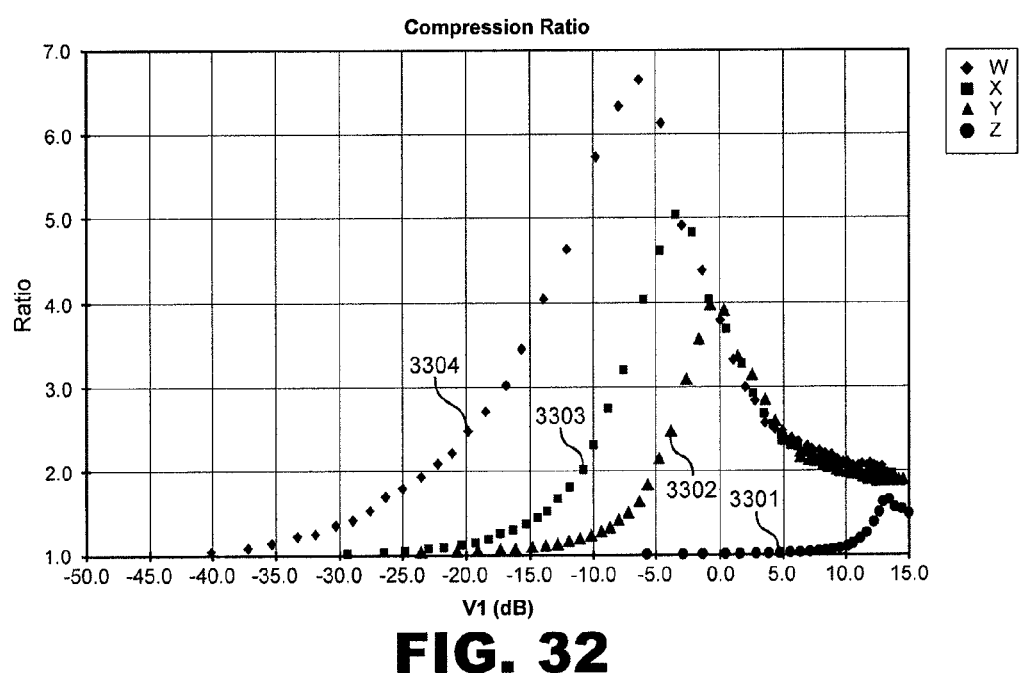
FIG. 32 shows the compression ratio at four gain values of the adjustable feedback amplifier.

FIG. 32 shows gain curves 3301-3304 to illustrate that with a greater value of "A", the compressor 2900 provides a relatively greater compression ratio. The gain curve 3301 shows that when A=−2.5, the compressor 2900 provides a compression ratio that is always less than 2:1 regardless of the input signal. The gain curve 3304 shows that when A=0.65, the compression ratio peaks to nearly 7:1 at an input signal between −10.0 dB and −5.0 dB.

Figure 33:
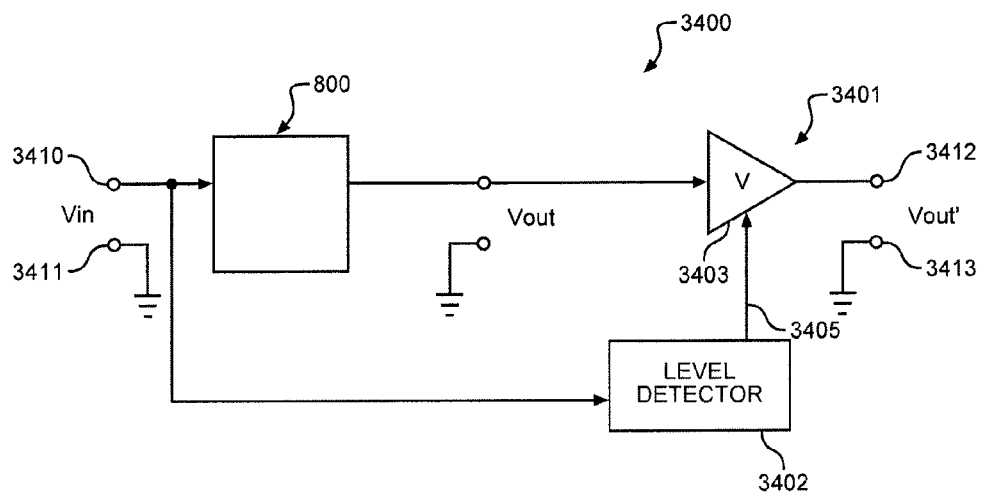
FIG. 33 is another embodiment which comprises a compressor/expander combination, which includes a compressor circuit and an expander circuit for reducing audio feedback from an "open mic"

FIG. 33 illustrates an embodiment of a compressor/expander circuit 3400 that includes the compressor 800 (of FIG. 7), and an expander circuit 3401 comprising a level detector 3402 and a variable gain amplifier 3403. It should be noted that any compressor embodiment disclosed herein can be substituted for the compressor 800. The compressor/expander 3400 provides an additional margin of safety to the loudspeaker by reducing audio feedback for a microphone used in a less-than-ideal arrangement 3500 as shown in FIG. 34.

Figure 34:
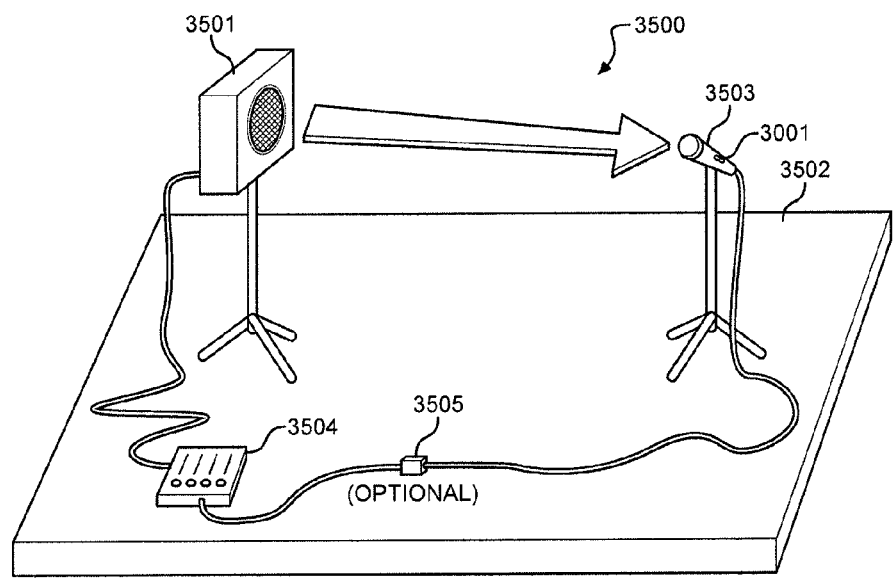
FIG. 34 shows a less-than-ideal arrangement where sound from a loudspeaker can enter the input end of a microphone.

FIG. 34 shows the less-than-ideal arrangement 3500 where a loudspeaker 3501 is located on a stage 3502 with a microphone 3503 and a mixing console 3504. Not shown is a power amplifier which can be located inside the mixer 3504, inside the speaker 3501, or inside another enclosure. This arrangement is less than ideal because sound from the loudspeaker 3501 can enter the transducer located at the input end of the microphone 3503. The compressor/expander 3400 is located inside the body of the microphone 3503 and the potentiometer 3001 is accessible for adjustment. Alternatively, the compressor/expander 3400 can be located in an in-line enclosure 3505, or the compressor/expander 3400 can be located inside the mixer 3504 or the power amplifier enclosure.

The compressor/expander 3400 can replace the compressor 1700 in FIG. 18. As such, the compressor 1700 is removed from the circuit, terminals 3410, 3411, 3412, 3413 of the compressor/expander 3400 are connected to the terminals 1702, 1703, 1705, 1706 of the circuit 1910 respectively, and the terminals 1713, 1714 are unconnected.

In operation, the compressor/expander 3400 operates like the stage microphone 1800 of FIG. 17 when input signal Vin is above a predetermined level because the detector 3402 provides a constant gain-control signal 3405 to the amplifier 3403. When Vin is below the predetermined level, the detector 3402 changes the control signal 3405 to decrease the gain of the amplifier 3403. In this embodiment, a further decrease in Vin below the predetermined level, causes the detector 3402 to further decreases the gain of the amplifier 3403. By these actions, the compressor/expander 3400 automatically reduces the gain of the microphone 3503 when it is unused to decrease feedback from the so-called "open mic". The compressor/expander 3400 provides the benefit of decreased sensitivity to background noise when the microphone 3503 is unused.

Figure 35:
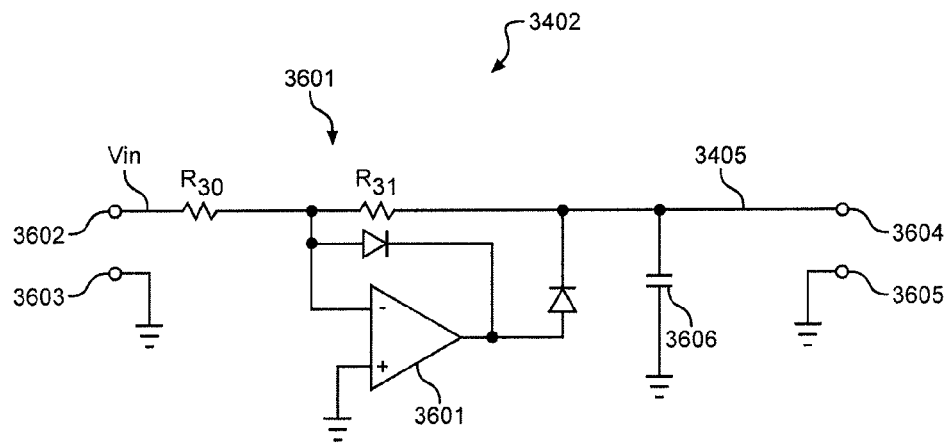
FIG. 35 shows a level detector for a compressor/expander circuit.

FIG. 35 shows an embodiment of the level detector 3402 (FIG. 33) having input terminals 3602, 3603 and output terminals 3604, 3605. The level detector 3402 includes a rectifier circuit 3610 for converting the AC voltage of Vin to a DC control voltage. The rectifier circuit 3610 comprises an op-amp 3501, two resistors, and two diodes. A capacitor 3606 is an integrator that filters ripple from the DC control voltage to provide the gain-control signal 3405.

In operation, the rectifier 3610 has sufficient gain to be in saturation when Vin is above the predetermined level. While saturated, the rectifier 3610 makes the control signal 3405 a constant DC voltage so that the amplifier 3403 provides a constant gain. When Vin decreases below the predetermined level, the rectifier 3610 and the capacitor 3606 provide a decreased DC control voltage to the gain-control signal 3405. The decrease in the gain-control signal 3405 decreases the gain of the amplifier 3403. In this embodiment, the output audio signal of the compressor 800 is an intermediate output signal which is fed to the input terminals of the amplifier 3403. The intermediate output signal is not fed to the 3-pin male XLR connector 1805. Instead, the output signal of the amplifier 3403 at the terminals 3412,3413 is fed to the 3-pin male XLR connector 1805.

Figure 36:
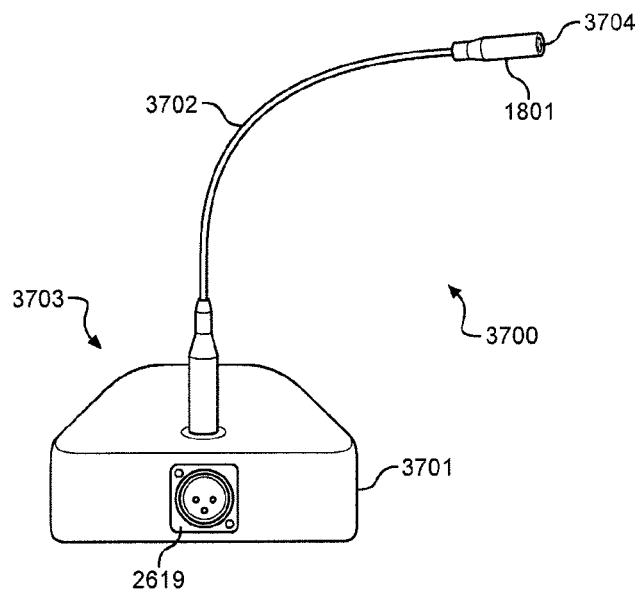
FIG. 36 shows an embodiment in which an audio level compressor is located in a base unit of a conference microphone.

FIG. 36 shows an embodiment where a conference microphone 3700 has a body 3703 comprising a base unit 3701, a neck 3702, and a windscreen 3704. The transducer 1801 is located in the windscreen 3704. The 3-pin male XLR connector 2619 and the audio compressor 2600 (of FIG. 25) are located in the base unit 3701.

Figure 37:
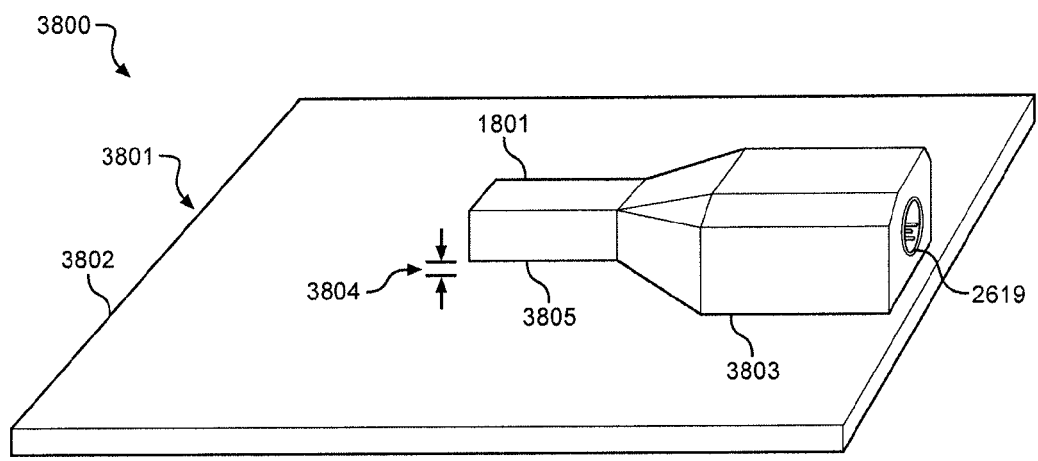
FIG. 37 shows an embodiment in which an audio level compressor is located in a PZM microphone.

FIG. 37 shows an embodiment where a PZM microphone 3800 has a body 3801 comprising a base plate 3802, a connector housing 3803, and a transducer housing 3805. The transducer housing 3805 has an acoustic input port through which the acoustic energy can travel to the transducer 1801. The transducer 1801 is preferably located in the transducer housing 3805. The acoustic input port is located a few millimeters from the surface of the base plate 3802 to create an air gap 3804 between the base plate 3802 and the acoustic input port. The air gap 3804 is preferably less than 10 millimeters wide. The 3-pin male XLR connector 2619 and the audio compressor 2600 (of FIG. 25) are located in the connector housing 3803.

It should be noted that there is no theory of operation that prohibits the embodiments from being used with other kinds of signal processing equipment such as noise gates, limiters, expanders, or other kinds of compressors. Nor is there a theory that prohibits use with any kind of audio signal source, which for example can include musical instruments, computer audio outputs, recorded music and microphones not intended for stage use. For the compressor circuits of FIGS. 7, 15, 16, 27, and 28, the load resistance is not present in the denominators of the corresponding transfer functions. As such there is no requirement for the filament resistance to be greater than the load resistance in order to increase dynamic range compression.

While preferred embodiments of the invention have been disclosed and illustrated and described, it will be appreciated that other embodiments, adaptations and variations of the invention will be readily apparent to those skilled in the art.

I claim:

1. An audio device for providing an output audio signal comprising:
   input terminals for receiving an input audio signal;
   a filament voltage;
   a lamp comprising a filament having a filament resistance, the filament resistance being a function of the filament voltage;
   a signal gain controller for providing a signal gain, the signal gain being a function of the filament resistance;
   output terminals for providing the output audio signal, the output audio signal being a function of the input audio signal and the signal gain;
   wherein the lamp is selected to enable fast attack/release time of the signal gain to change the character or the tone quality of the output audio signal.

2. The audio device of claim 1, wherein the lamp comprises a small filament having a length of less than about 3 millimeters, the small filament being selected to enable fast attack/release time.

3. The audio device of claim 1, wherein the lamp is selected for low power consumption to enable fast attack/release time, and the filament voltage has a predetermined signal level to illuminate the filament; the audio device further comprising:
   lamp terminals coupled to the filament, the filament voltage being referenced to the lamp terminals, the filament voltage inducing a filament current to flow through the filament;
   the filament current to illuminate the lamp being greater than about 6.5 milliamperes and less than about 13 milliamperes.

4. The audio device of claim 3, wherein the filament voltage to illuminate the lamp is greater than about 0.5 volts and less than about 2.5 volts.

5. The audio device of claim 1, further comprising a lamp driver having an amplifier for providing a drive signal, the drive signal being coupled to the filament to provide the filament voltage.

6. The audio device of claim 5, wherein:
   the input audio signal comprises a plurality of input signals;
   the amplifier comprises a plurality of amplifier input terminals for receiving the plurality of input signals; and
   the amplifier accepts the plurality of input signals to provide the drive signal.

7. The audio device of claim 6, wherein the plurality of input signals comprises a first input signal and a second input signal, the second input signal being out-of-phase relative to the first input signal.

8. The audio device of claim 1, further comprising a plurality of drive signals and a plurality of amplifiers, each of the plurality of amplifiers providing a drive signal, the plurality of drive signals being coupled to the filament to provide the filament voltage.

9. The audio device of claim 8, wherein the plurality of drive signals includes a first dive signal and a second drive signal, the first dive signal comprising the input audio signal, and the second drive signal being out-of-phase relative to the first dive signal.

10. The audio device of claim 1, further comprising lamp terminals coupled to the filament, at least one of the lamp terminals receiving the input audio signal to provide the filament voltage.

11. The audio device of claim 1, further comprising a signal gain controller component for compressing the dynamic range of the output audio signal.

12. The audio device of claim 11, wherein the signal gain controller component comprises:
    a left lamp terminal coupled to the filament;
    a right lamp terminal coupled to the filament;
    a load coupled to the right lamp terminal;
    wherein the left lamp terminal is coupled to at least one of the input terminals of the audio device, the right lamp terminal is coupled to at least one of the output terminals of the audio device.

13. The audio device of claim 11, wherein the signal gain controller component comprises:
    an amplifier having a feedback terminal and an amplifier output terminal; and
    an amplifier component coupled to the feedback terminal for providing feedback from the amplifier output terminal to the feedback terminal.

14. The audio device of claim 13, wherein:
    the amplifier includes an inverting input coupled to the feedback terminal;
    the amplifier component comprises a load coupled to the amplifier output terminal; and
    the load and the filament are coupled to the inverting input of the amplifier via the feedback terminal.

15. The audio device of claim 13, wherein:
    the amplifier includes a non-inverting input coupled to the feedback terminal;
    the amplifier component comprises a positive feedback network and a load;
    the load is coupled to the filament; and
    the positive feedback network is coupled to the amplifier output terminal and the feedback terminal.

16. The audio device of claim 1, wherein the signal gain is less than 1.

17. An audio level compressor comprising:
    input terminals for receiving an input audio signal;
    a filament voltage;
    a lamp comprising a filament having a filament resistance, the filament resistance being a function of the filament voltage;
    a signal gain controller for providing a signal gain, the signal gain being a function of the filament resistance, the signal gain controller having output terminals for providing an output audio signal, the output audio signal being a function of the input audio signal and the signal gain; and an output connector for providing the output audio signal, the output connector comprising pins suitably arranged for coupling to a 3-pin female XLR connector.

18. The audio level compressor of claim 17, wherein the output connector includes a first pin, a second pin, and a third pin, and the audio level compressor further comprises:
    a phantom power source coupled to the output connector, the phantom power source having a first terminal coupled to the first pin, a second terminal coupled to the second pin, and a third terminal coupled to the third pin;
    the phantom power source providing DC voltage to the output connector.

19. The audio level compressor of claim 18, wherein the signal gain controller comprises:
    a power conditioner coupled to the output connector;
    the power conditioner accepting the DC voltage from the output connector to provide power to the signal gain controller; and
    the power conditioner coupling the output audio signal to the output connector.

20. The audio level compressor of claim 17, wherein the filament voltage has a predetermined signal level to illuminate the lamp; and the audio level compressor further comprises:
    lamp terminals coupled to the filament, the filament voltage being referenced to the lamp terminals, the filament voltage inducing a filament current to flow through the filament;
    the filament current to illuminate the lamp being greater than about 6.5 milliamperes and less than about 13 milliamperes.

21. The audio level compressor of claim 20, wherein the filament voltage to illuminate the lamp is greater than about 0.5 volts and less than about 2.5 volts.

22. The audio level compressor of claim 17, further comprising lamp terminals coupled to the filament, the input audio signal being coupled to at least one of the lamp terminals to provide the filament voltage.

23. The audio level compressor of claim 17, further comprising an amplifier coupled to the input terminals and the filament, the amplifier accepting the input audio signal to provide the filament voltage.

24. The audio level compressor of claim 17, further comprising a structure coupled to the output connector, the lamp and the signal gain controller being located in the structure.

25. The audio level compressor of claim 17, wherein the signal gain is less than 1.

26. A stage microphone that receives power from a phantom power source and provides an output audio signal, the microphone comprising:
    a body having an input end and an output end;
    a windscreen located at the input end;
    a transducer located behind the windscreen, the transducer accepting acoustic energy to generate an input audio signal;
    a microphone output connector comprising pins suitably arranged for coupling to a 3-pin female XLR connector, the microphone output connector being coupled to the phantom power source;
    a dynamic range compressor located in the body, the compressor comprising:
        input terminals for receiving the input audio signal from the transducer;
        a signal gain controller for providing a signal gain, the signal gain being a function of the input audio signal;
        output terminals for providing the output audio signal, the output audio signal being a function of the input audio signal and the signal gain; and
        power input terminals for accepting power for the compressor;
    a power conditioner coupled to the microphone output connector, the power conditioner coupling power from the phantom power source to the compressor via the microphone output connector and the power input terminals, the power conditioner coupling the output audio signal to the microphone output connector.

27. The stage microphone of claim 26, wherein the microphone output connector comprises a first pin, a second pin, and a third pin; the first pin being coupled to a ground reference potential.

28. The stage microphone of claim 27, wherein:
    the phantom power source includes a first terminal coupled to the first pin, a second terminal coupled to the second pin, and a third terminal coupled to the third pin;
    the phantom power source providing a DC voltage to the microphone output connector via at least one of the second terminal and the third terminal; and
    the phantom power source providing a reference potential to the microphone output connector via the first terminal.

29. The stage microphone of claim 28, further comprising:
    a microphone cable having a female connector;
    a mixing console having a mixer input coupled to the phantom power source;
    the microphone cable being coupled to the mixer input; and
    the female connector being coupled to the microphone output connector to provide the DC voltage to the microphone output connector.

30. The stage microphone of claim 28, further comprising a microphone cable coupling the microphone output connector to the phantom power source.

31. The stage microphone of claim 26, further comprising a microphone cable coupling the body to the microphone output connector.

32. The stage microphone of claim 26, wherein the compressor further comprises a lamp having a filament with a filament resistance, the filament resistance being a function of the input audio signal, the signal gain being a function of the filament resistance.

33. The stage microphone of claim 26, wherein the signal gain controller comprises:
    a signal gain controller component for accepting the output audio signal to provide a DC control voltage; and
    a transistor for accepting the DC control voltage to decrease the signal gain of the signal gain controller when the output audio signal is greater than a predetermined level.

34. The stage microphone of claim 26, further comprising an expander for decreasing the output audio signal when the input audio signal is below a predetermined signal level.

35. The stage microphone of claim 34, wherein the expander comprises:
    a detector having an output terminal for providing a gain-control signal, the gain-control signal being a function of the input audio signal;
    a variable gain amplifier having an amplifier input terminal, an amplifier output terminal, and a control terminal;

the control terminal being coupled to the output terminal of the detector, the control terminal receiving the gain-control signal to control a signal gain of the variable gain amplifier;

the amplifier input terminal being coupled to the compressor, the amplifier input terminal providing an intermediate output signal to the variable gain amplifier;

the amplifier output terminal being coupled to the microphone output connector to provide the output audio signal to the microphone output connector, the output audio signal being a function of the intermediate output signal; and the gain-control signal decreasing the signal gain of the variable gain amplifier to decrease the output audio signal when the input audio signal is below the predetermined signal level.

36. The stage microphone of claim 26, wherein the signal gain is less than 1.

37. A microphone comprising:
a body;
a transducer located in the body, the transducer accepting acoustic energy to produce an input audio signal;
a microphone output connector;
a signal gain controller located in the body for providing a signal gain, the signal gain controller comprising:
input terminals for receiving the input audio signal;
a lamp comprising a filament having a filament resistance, the filament resistance being a function of the input audio signal, the signal gain being a function of the filament resistance; and
output terminals coupled to the microphone output connector, the output terminals providing an output audio signal, the output audio signal being a function of the input audio signal and the signal gain.

38. The microphone of claim 37, further comprising a battery located in the body for providing power to the signal gain controller.

39. The microphone of claim 37, wherein the microphone output connector comprises pins suitably arranged for coupling to a 3-pin female XLR connector.

40. The microphone compressor of claim 39, wherein the microphone output connector comprises a first pin, a second pin, and a third pin; the first pin being coupled to a ground reference potential.

41. The microphone of claim 40, further comprising:
a phantom power source coupled to the microphone output connector;
the phantom power source having a first terminal coupled to the first pin, a second terminal coupled to the second pin, and a third terminal coupled to the third pin;
the phantom power source providing a DC voltage to the microphone output connector via at least one of the second terminal and the third terminal; and
the phantom power source providing a reference potential to the microphone output connector via the first terminal.

42. The microphone of claim 41, wherein the signal gain controller comprises:
a power conditioner coupled to the microphone output connector;
the power conditioner accepting the DC voltage from the phantom power source to provide power to the signal gain controller; and
the power conditioner coupling the output audio signal to the microphone output connector.

43. The microphone of claim 41, further comprising:
a mixing console having a mixer input coupled to the phantom power source; and
a microphone cable coupling the mixer input to the microphone output connector.

44. The microphone of claim 41, further comprising a microphone cable coupling the microphone output connector to the phantom power source.

45. The microphone of claim 37, further comprising a microphone cable coupling the body to the microphone output connector, the microphone output connector being located remotely from the body.

46. The microphone of claim 37, wherein the lamp is selected for low power consumption and the input audio signal has a predetermined signal level to illuminate the lamp, the audio level compressor further comprising:
lamp terminals coupled to the filament;
a filament voltage referenced to the lamp terminals, the filament voltage inducing a filament current to flow through the filament;
the filament current to illuminate the lamp being greater than about 6.5 milliamperes and less than about 13 milliamperes.

47. The microphone of claim 46, wherein the filament voltage to illuminate the lamp is greater than about 0.5 volts and less than about 2.5 volts.

48. The microphone of claim 37, wherein the signal gain is less than 1.

49. The microphone of claim 37, further comprising:
a base unit, a neck, and a windscreen;
the transducer being located behind the windscreen;
the signal gain controller being located in the base unit; and
the microphone output connector being coupled to the base unit.

50. The microphone of claim 37, further comprising a base plate, an acoustic input port, and an air gap located between the acoustic input port and the base plate, the air gap being less than about 10 millimeters.

51. A microphone for accepting acoustic energy and providing an output audio signal, the microphone comprising:
a structure;
a transducer located in the structure; and
a signal processor located in the structure, the signal processor comprising a filament having a filament resistance;
wherein the transducer accepts the acoustic energy and provides an input audio signal to the signal processor; and
the signal processor processes the input audio signal and provides the output audio signal, the output audio signal being responsive to the filament resistance.

52. The microphone of claim 51, further comprising a microphone output connector for accepting the output audio signal, the microphone output connector comprising pins suitably arranged for coupling to a 3-pin female XLR connector.

53. The microphone of claim 52, wherein the microphone output connector comprises a first pin, a second pin, and a third pin; the first pin being coupled to a ground reference potential.

54. The microphone of claim 53, further comprising:
a phantom power source coupled to the microphone output connector;
the phantom power source having a first terminal coupled to the first pin, a second terminal coupled to the second pin, and a third terminal coupled to the third pin; and the phantom power source providing DC voltage to the signal processor via the microphone output connector.

55. The microphone of claim 51, wherein the signal processor further comprises an amplifier including an amplifier input terminal, a feedback terminal, an amplifier output terminal and an amplifier component; the amplifier input terminal receiving the input audio signal; and the microphone further comprises an amplifier component coupled to the feedback terminal and the amplifier output terminal, the amplifier component providing feedback to the feedback terminal from the amplifier output terminal.

56. The microphone of claim 51, wherein the filament has a length of less than about 3 millimeters.

57. The microphone of claim 51, wherein the input audio signal has a predetermined signal level to illuminate the filament; the microphone further comprising:

lamp terminals coupled to the filament;

a filament voltage referenced to the lamp terminals, the filament voltage inducing a filament current to flow through the filament; and the filament current to illuminate the filament being greater than about 6.5 milliamperes and less than about 13 milliamperes.

58. The microphone of claim 51, wherein the filament voltage to illuminate the filament is greater than about 0.5 volts and less than about 2.5 volts.

\* \* \* \* \*